US009362292B1

(12) United States Patent
Liaw

(10) Patent No.: US 9,362,292 B1
(45) Date of Patent: Jun. 7, 2016

(54) TWO-PORT SRAM CELL STRUCTURE FOR VERTICAL DEVICES

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/690,068

(22) Filed: Apr. 17, 2015

(51) Int. Cl.
*H01L 29/66* (2006.01)
*H01L 27/11* (2006.01)
*H01L 27/092* (2006.01)

(52) U.S. Cl.
CPC ........ *H01L 27/1104* (2013.01); *H01L 27/0922* (2013.01)

(58) Field of Classification Search
USPC .......................................... 438/268; 257/329
See application file for complete search history.

(56) References Cited

U.S. PATENT DOCUMENTS

| 8,315,084 | B2 | 11/2012 | Liaw et al. |
| 8,421,205 | B2 | 4/2013 | Yang |
| 8,605,523 | B2 | 12/2013 | Tao et al. |
| 8,630,132 | B2 | 1/2014 | Cheng et al. |
| 8,661,389 | B2 | 2/2014 | Chern et al. |
| 8,698,205 | B2 | 4/2014 | Tzeng et al. |
| 8,760,948 | B2 | 6/2014 | Tao et al. |
| 8,826,212 | B2 | 9/2014 | Yeh et al. |
| 8,836,141 | B2 | 9/2014 | Chi et al. |
| 2010/0259971 | A1* | 10/2010 | Liaw .................. G11C 8/16 365/154 |
| 2013/0242644 | A1* | 9/2013 | Lin .................. G11C 11/41 365/154 |
| 2014/0032871 | A1 | 1/2014 | Hsu et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0215420 | A1 | 7/2014 | Lin et al. |
| 2014/0233330 | A1 | 8/2014 | Ko et al. |
| 2014/0241077 | A1 | 8/2014 | Katoch et al. |
| 2014/0264924 | A1 | 9/2014 | Yu et al. |
| 2014/0269114 | A1 | 9/2014 | Yang et al. |
| 2014/0282289 | A1 | 9/2014 | Hsu et al. |
| 2014/0325466 | A1 | 10/2014 | Ke et al. |

* cited by examiner

*Primary Examiner* — Tuan Nguyen
(74) *Attorney, Agent, or Firm* — Slater Matsil, LLP

(57) ABSTRACT

Two-Port SRAM cells are described. In an embodiment, a cell includes first, second, and read-port pull-down, first and second pull-up, first, second, and read-port pass-gate transistors. Each transistor includes a first source/drain region in an active area, a channel extending above the active area, and a second source/drain region above the channel. First source/drain regions of pull-down transistors are electrically coupled through a first active area. First source/drain regions of pull-up transistors are electrically coupled through a second active area. A first gate electrode is around channels of the first pull-up, first pull-down, and read-port pull-down transistors. A second gate electrode is around the channels of the second pull-up and pull-down transistors. Second source/drain regions of the first pull-up, pull-down, and pass-gate transistors are electrically coupled to the second gate electrode. Second source/drain regions of the second pull-up, pull-down, and pass-gate transistors are electrically coupled to the first gate electrode.

20 Claims, 38 Drawing Sheets

TWO-PORT SRAM CELL STRUCTURE FOR VERTICAL DEVICES

BACKGROUND

Static Random Access Memory (SRAM) is commonly used in integrated circuits. SRAM cells have the advantageous feature of holding data without a need for refreshing. With the increasingly demanding requirement to the speed of integrated circuits, the read speed and write speed of SRAM cells also become more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
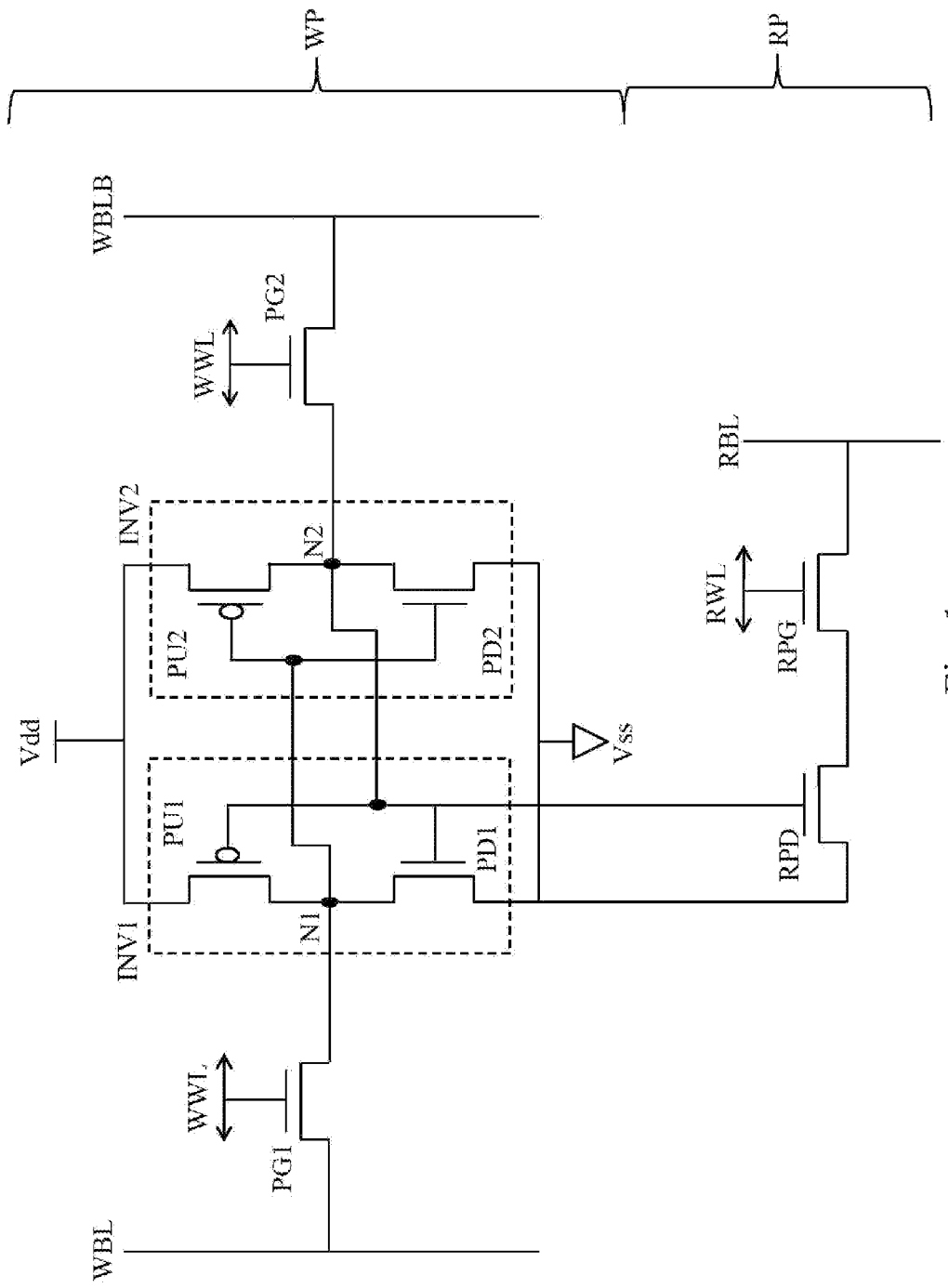
FIG. 1 is a circuit diagram of a Two-Port Static Random Access Memory (SRAM) bit cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static Random Access Memory (SRAM) cells, such as Two-Port SRAM cells, comprising Vertical Gate-All-Around (VGAA) devices are provided in accordance with various example embodiments. Some variations of the embodiments are discussed. Throughout the various views and illustrative embodiments, like reference numbers are used to designate like elements. Further, method embodiments discussed herein may be discussed as being performed in a particular order; however, other method embodiments may be performed in any logical order.

FIG. 1 illustrates a circuit diagram of a Two-Port SRAM bit cell in accordance with some embodiments. FIG. 1 illustrates a write port portion WP and a read-port portion RP. The cell includes pull-up transistors PU1 and PU2, pull-down transistors PD1 and PD2, and pass-gate transistors PG1 and PG2 in the write port portion WP, and includes a read-port pull-down transistor RPD and a read-port pass-gate transistor RPG in the read-port portion RP. As show in the circuit diagram, pull-up transistors PU1 and PU2 are p-type transistors, and transistors PD1, PD2, PG1, PG2, RPD, and RPG are n-type transistors.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a data latch. The gates of transistors PU1 and PD1 are coupled together and to the drains of transistors PU2 and PD2, and the gates of transistors PU2 and PD2 are coupled together and to the drains of transistors PU1 and PD1. Sources of the pull-up transistors PU1 and PU2 are coupled to a first power voltage Vdd, and the sources of the pull-down transistors PD1 and PD2 are coupled to a second power voltage Vss, e.g., ground. As illustrated, the transistors PU1 and PD1 form a first inverter INV1 between the first power voltage Vdd and the second power voltage Vss, and the transistors PU2 and PD2 form a second inverter INV2 between the first power voltage Vdd and the second power voltage Vss. The inverters INV1 and INV2 are cross-coupled to form the data latch.

Storage node N1 of the data latch is coupled to a write bit line WBL through the first pass-gate transistor PG1, and storage node N2 is coupled to a complementary write bit line WBLB through the second pass-gate transistor PG2. Storage nodes N1 and N2 are complementary nodes that are often at opposite logic levels (logic high or logic low). The gates of the first pass-gate transistor PG1 and the second pass-gate transistor PG2 are coupled to a write word line WWL.

The source of the read-port pull-down transistor RPD is coupled to the second power voltage Vss, and the gate of the read-port pull-down transistor RPD is coupled to the storage node N2. The drain of the read-port pull-down transistor RPD is coupled to the source of the read-port pass-gate transistor RPG. The gate of the read-port pass-gate transistor RPG is coupled to a read-port word line RWL, and the drain of the read-port pass-gate transistor RPG is coupled to a read-port bit line RBL.

Features of various embodiments discussed below may have reference characters indicating a level, as will be discussed subsequently, post-fixed with a node reference as discussed above with respect to FIG. 1. For example, a first metallization trace that is a node for the write bit line may be indicated as "M1-WBL."

FIGS. 2 through 24A illustrate cross sectional views of intermediate steps during a process for forming VGAA device structures in accordance with some embodiments. FIGS. 24B and 24C illustrate overlaid layout views of VGAA device structures formed by the process discussed with respect to FIGS. 2 through 24A. The various views are not necessarily representative of a cross section or layout of a Two-Port SRAM cell discussed below. The cross sectional and layout views, and a method discussed in the context of these views, are provided to illustrate aspects of VGAA device structures and how they are formed and to provide a reference for features discussed with respect to subsequent layouts. One of ordinary skill in the art will readily understand how to apply the discussion of FIGS. 2 through 24C to the layouts discussed subsequently.

Figure 2:
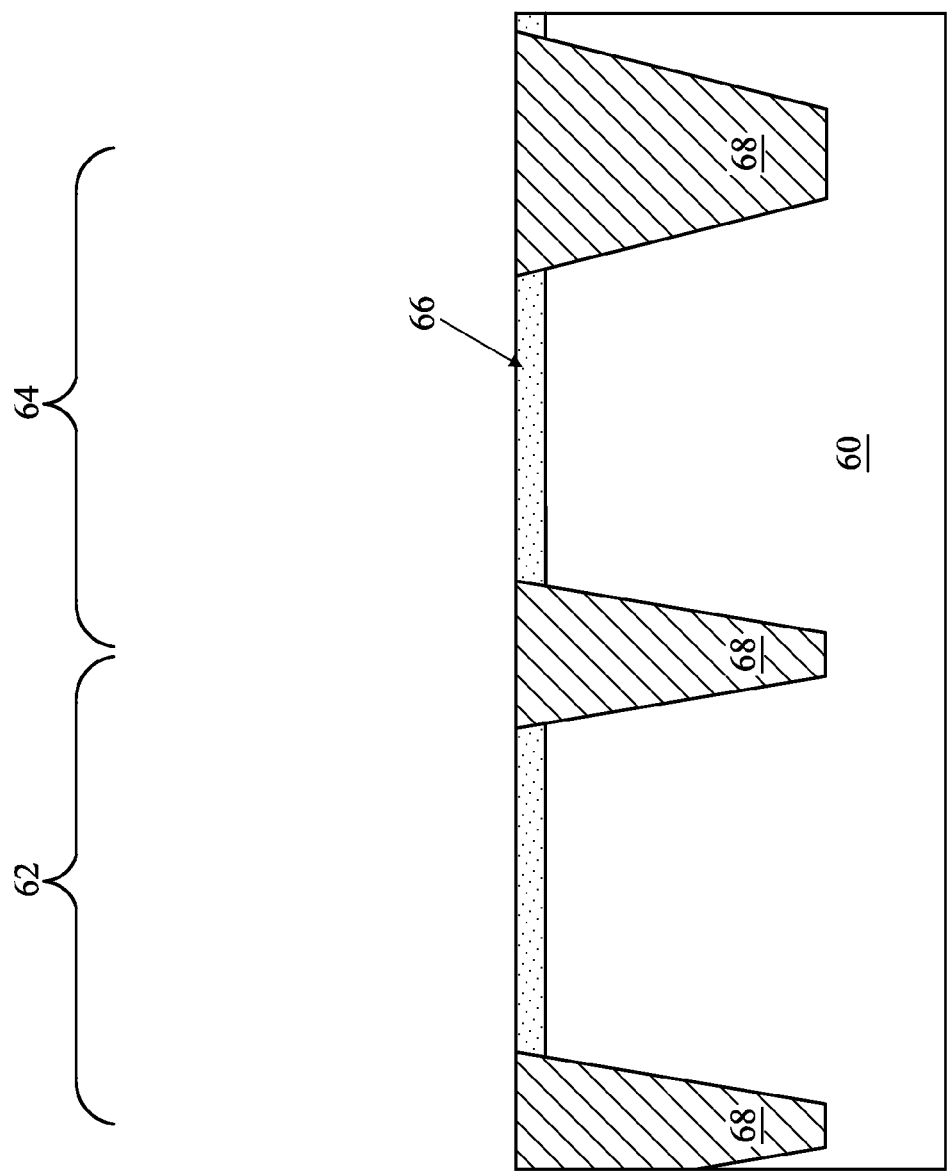
FIGS. 2 through 23 and 24A are cross sectional views of intermediate steps during a process for forming Vertical Gate-All-Around (VGAA) device structures in accordance with some embodiments.

FIG. 2 illustrates a substrate 60 with a mask layer 66 and isolation regions 68. The substrate 60 can be a bulk semiconductor substrate, a semiconductor-on-insulator (SOI) substrate, a multi-layered or gradient substrate, or the like. The semiconductor of the substrate 60 may include any semiconductor material, such as elemental semiconductor like silicon, germanium, or the like; a compound or alloy semiconductor including SiC, SiP, SiPC, GaAs, GaP, InP, InAs, indium antimonide, SiGe, GaAsP, AlInAs, AlGaAs, GaInAs, GaInP, and/or GaInAsP; the like; or a combinations thereof. The substrate 60 may further be a wafer, for example, which may further be a silicon wafer. The substrate 60 comprises a first region 62 for forming a first device type, e.g., n-type, and a second region 64 for forming a second device type, e.g., p-type.

The mask layer 66, such as a hardmask, is deposited on the substrate 60. The mask layer 66 may be formed of, for example, silicon nitride, silicon carbide, silicon oxynitride, silicon carbon nitride, or the like, and may be formed using Chemical Vapor Deposition (CVD), Plasma-Enhanced CVD (PECVD), Atomic Layer Deposition (ALD), or the like. The mask layer 66 is then patterned to expose the substrate 60, and recesses, or trenches, are etched in the substrate 60. The patterning and etching may use an acceptable photolithography and etching process, such as Reactive Ion Etching (RIE) or the like.

The recesses in the substrate 60 are then filled with a dielectric material to form the isolation regions 68. The isolation regions 68 may be referred to as Shallow Trench Isolation (STI) regions. The isolation regions 68 may be formed of silicon oxide deposited by a high density plasma, for example, although other dielectric materials formed according to various techniques may also be used. A planarization process, such as a Chemical Mechanical Polish (CMP), may be performed to remove excess dielectric material and form the top surface of the isolation regions 68 to be co-planar with the top surface of the mask layer 66. In other embodiments, the isolation regions can be formed by thermal oxidation to grow a dielectric material, such as silicon oxide.

Figure 3:
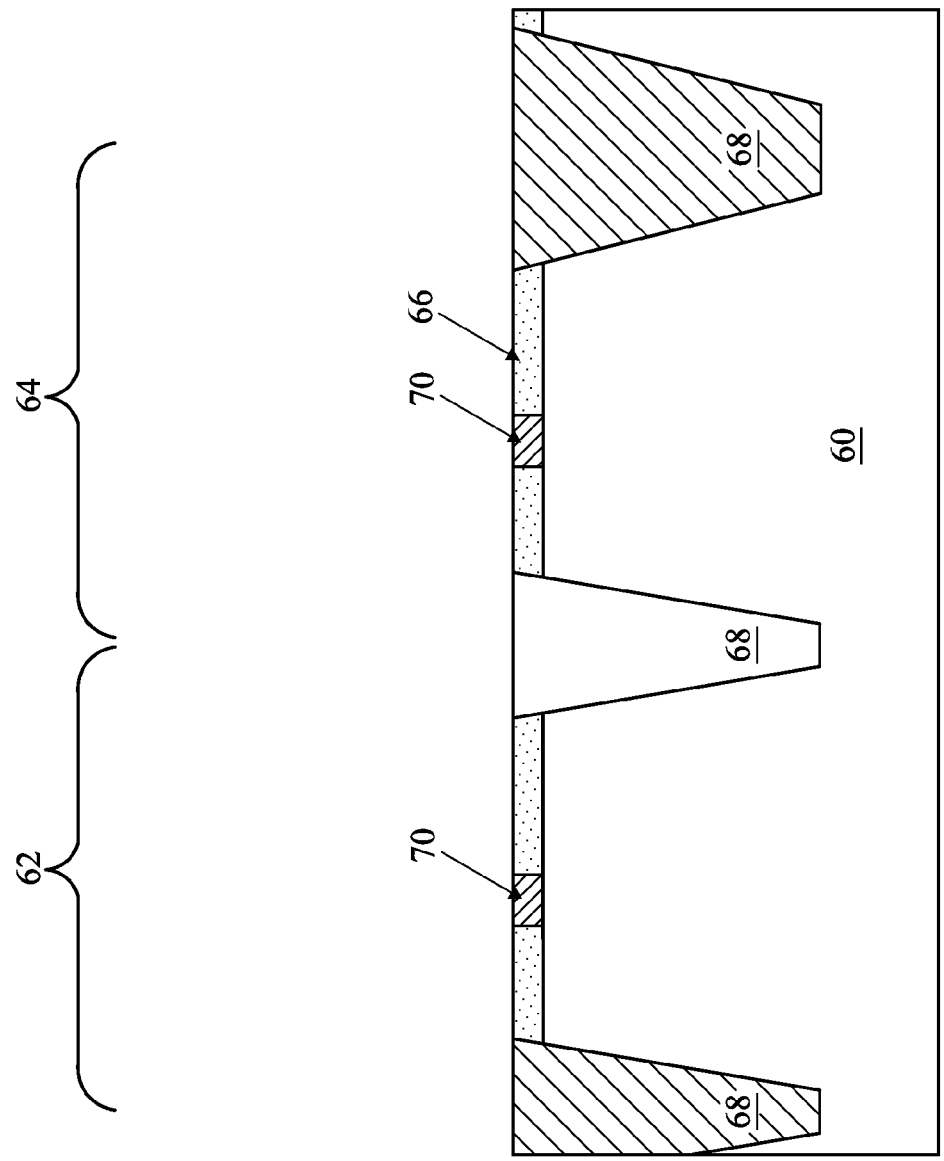

In FIG. 3, the mask layer 66 is patterned with openings corresponding to channel structures that are to be formed, and a mask cap 70 is formed in each opening in the mask layer 66. The mask layer 66 may be patterned using an acceptable photolithography and etching process, such as RIE or the like. The mask caps 70 can be formed by depositing a material with a different etch selectivity than the mask layer 66 in the openings and on the mask layer 66. The material of the mask cap 70 may be, for example, silicon nitride, silicon carbide, silicon oxynitride, silicon carbon nitride, or the like, and may be formed using CVD, PECVD, ALD, or the like. The material of the mask cap 70 may then be planarized, such as by a CMP, to form the mask caps 70 with top surfaces co-planar with the top surface of the mask layer 66.

Figure 4:
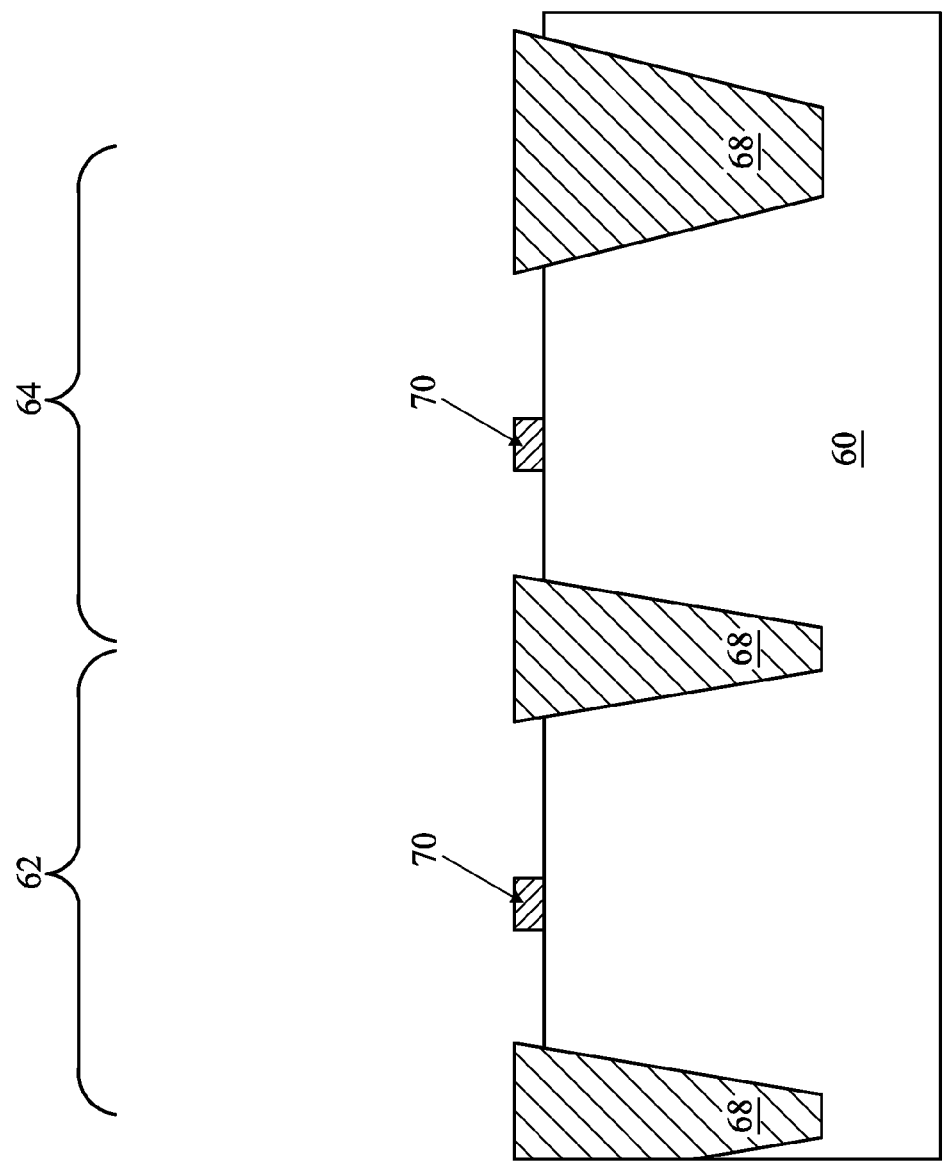
Figure 5:
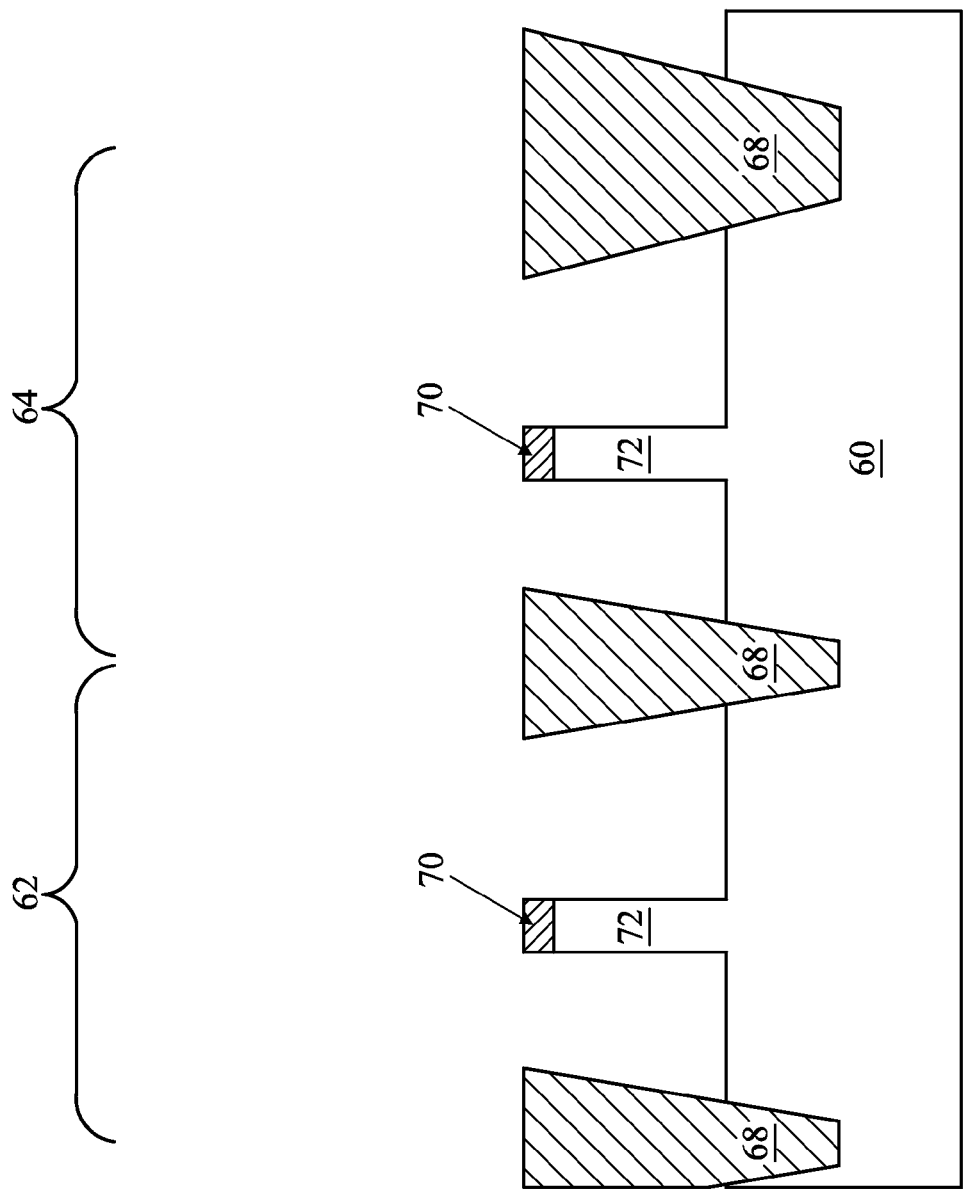

In FIG. 4, the mask layer 66 is removed, such as by an appropriate etch selective to the mask layer 66. In FIG. 5, vertical channel structures 72 are formed from the substrate 60. Using the mask caps 70 as a mask, the substrate 60 is recessed, such as by using an appropriate anisotropic etch such as RIE or the like, to form the vertical channel structures 72. The vertical channel structures 72 can have cross sections in a plane parallel to a top surface of the substrate 60 that are circles, squares, rectangles, ovals, ellipses, or the like. The vertical channel structures 72 may be referred to as nanowires. Although one vertical channel structure 72 is depicted for each transistor or device that is formed in the process discussed herein, each transistor or device can comprise multiple vertical channel structures, which can have any appropriate shape or combination of shapes. In other embodiments, the vertical channel structures 72 can include epitaxially growing the vertical channel structures 72. The epitaxial growth can use Ge, SiGe, SiC, SiP, SiPC, a III-V material, the like, or a combination thereof. Example III-V materials include InP, InAs, GaAs, AlInAs, InGaP, InGaAs, GaAsSb, GaPN, and AlPN.

Figure 6:
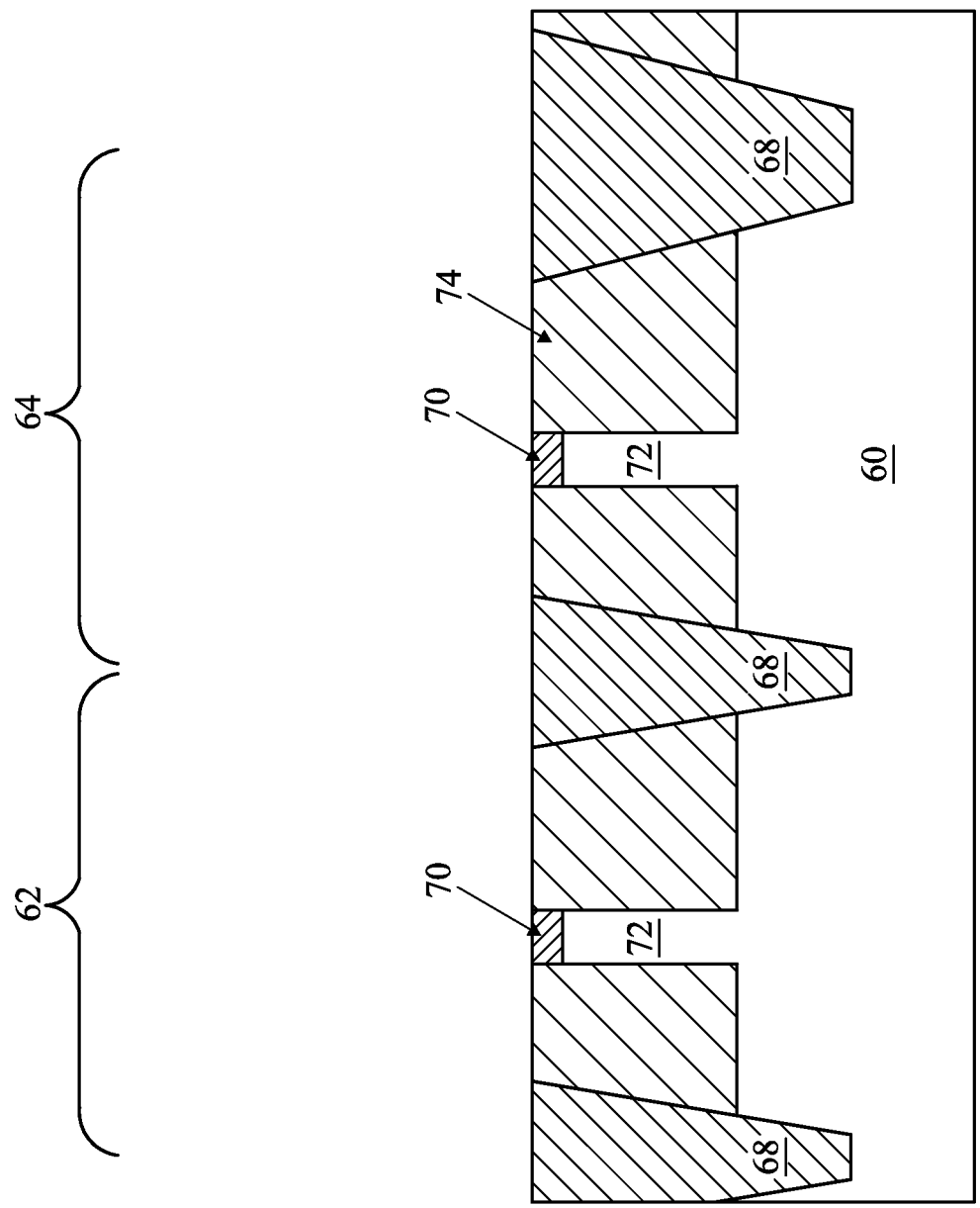
Figure 7:
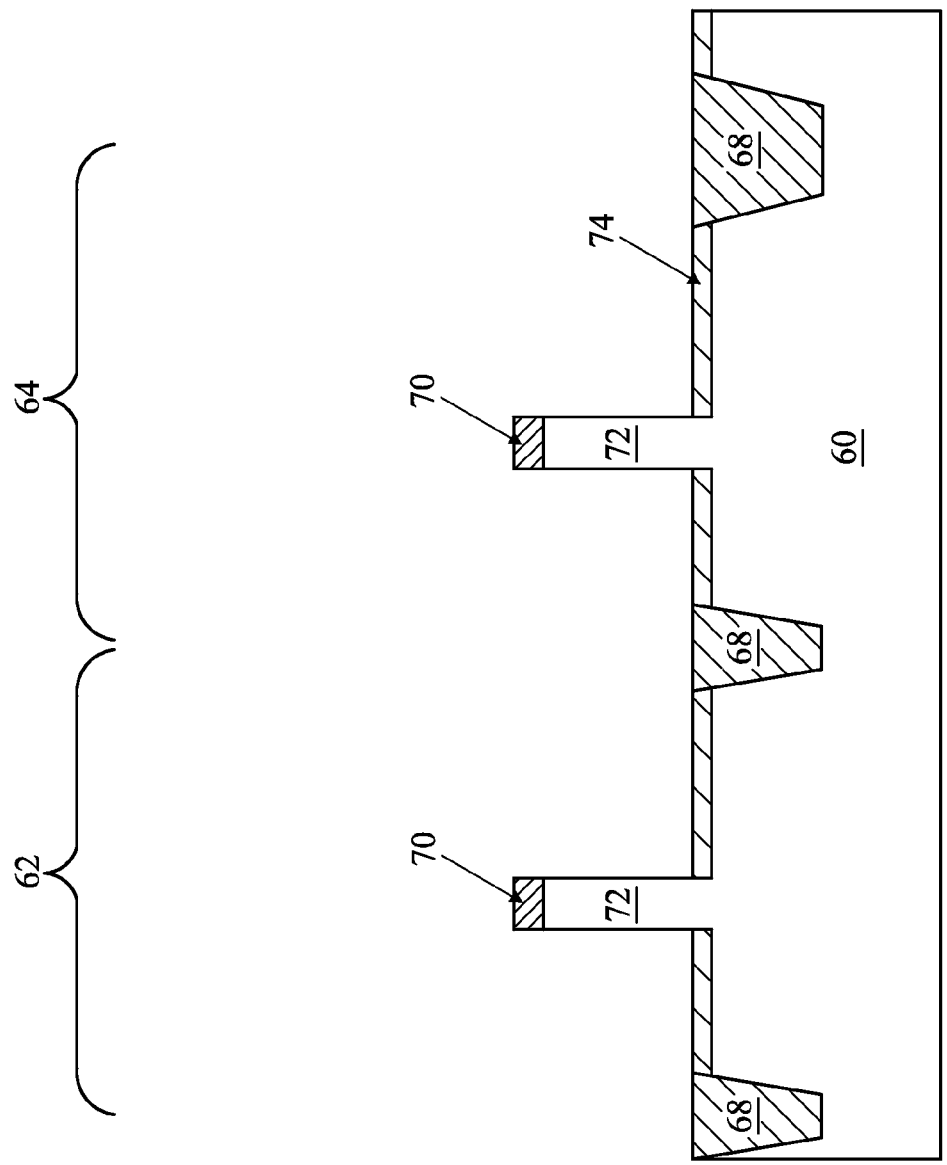

In FIG. 6, a filler dielectric layer 74 is formed on the substrate 60 and around the vertical channel structures 72. In some embodiments, the filler dielectric layer 74 is an oxide formed by a flowable CVD (FCVD) (e.g., a CVD-based material deposition in a remote plasma system) and a post curing, such as an anneal. In other embodiments, the filler dielectric layer 74 can be formed by an another deposition technique, such as CVD, PECVD, the like, or a combination thereof, and can be a dielectric material such as silicon oxide, phosphosilicate glass (PSG), borosilicate glass (BSG), borophosphosilicate glass (BPSG), un-doped silicate glass (USG), a nitride, oxynitride, or the like. After deposition of the filler dielectric layer 74, a CMP may be performed to planarize the filler dielectric layer 74 to have a top surface co-planar with top surface of the mask caps 70 and isolation regions 68. In FIG. 7, the filler dielectric layer 74 and the isolation regions 68 are etched back, such as by using an appropriate etch, such as RIE or the like, such that the vertical channel structures 72 protrude from the filler dielectric layer 74.

Figure 8:
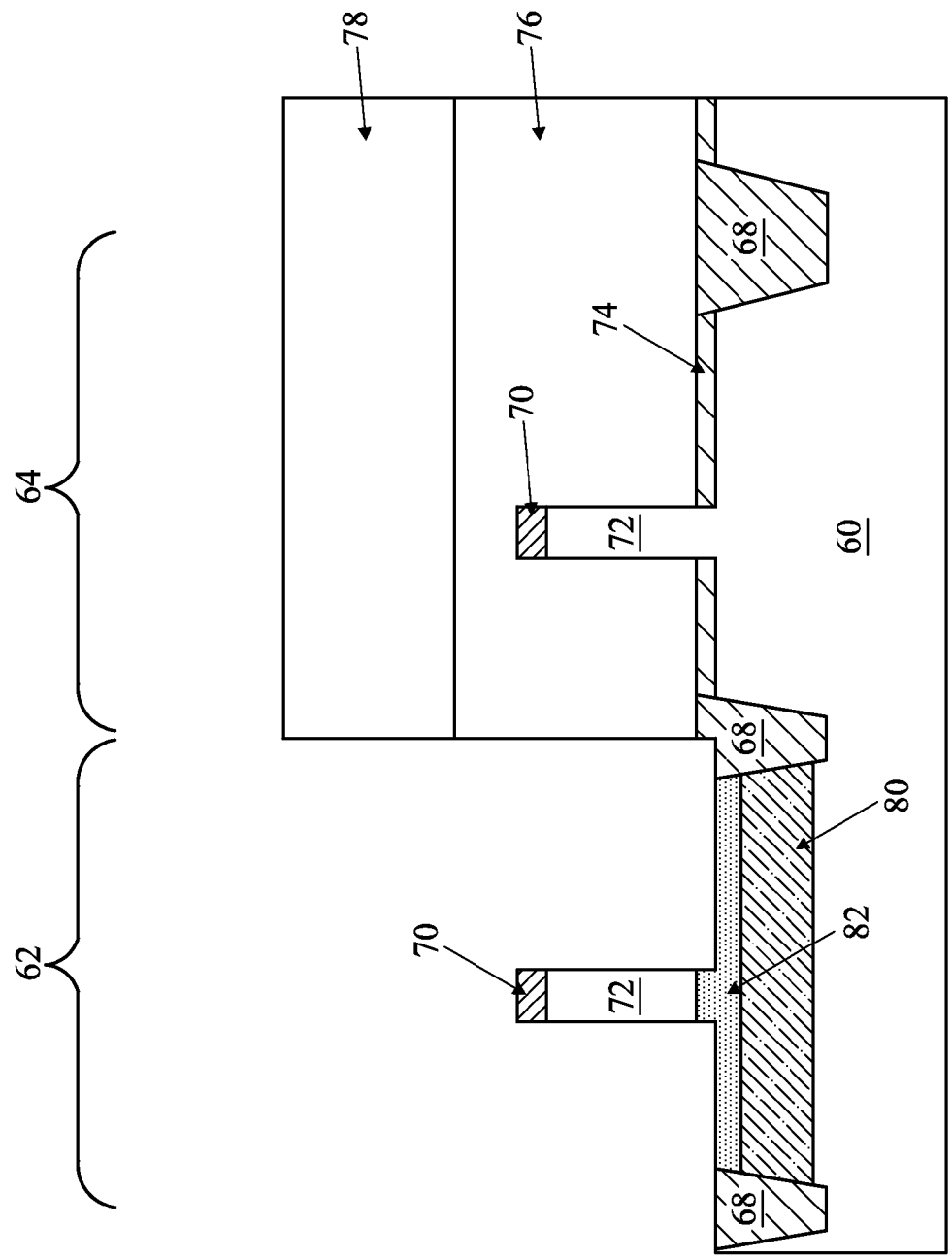

In FIG. 8, a bottom layer 76 and a photoresist 78 are formed on the second region 64 of the substrate 60. The bottom layer 76 may comprise a hard mask material such as silicon nitride, silicon carbide, silicon oxynitride, silicon carbon nitride, or the like formed by using CVD, PECVD, ALD, or the like. The bottom layer 76 may be planarized, such as by CMP. The bottom layer 76 can be initially formed in the first region 62 and the second region 64 of the substrate 60. The photoresist 78 is then formed and patterned on the bottom layer 76 in the second region 64. The photoresist 78 can be formed by using a spin-on technique and patterned using acceptable photolithography techniques. The portion of the bottom layer 76 in the first region 62 can then be removed, such as by etching, such as RIE or the like, using the photoresist 78 as a mask. The filler dielectric layer 74 can be removed from the first region 62 of the substrate 60 after the bottom layer 76 is removed.

The bottom layer 76 can remain in the second region 64 of the substrate 60 while exposing the first region 62 of the substrate 60.

Once the bottom layer 76 and the photoresist 78 are formed, a p-type dopant is implanted in the first region 62 of the substrate 60 to form a p-doped well 80. Example species for implanting p-type dopants include boron (B), $BF_2$, indium (In), nitrogen (N), carbon (C), the like, or a combination thereof. A concentration of a p-type dopant in the p-doped well 80 can be in a range from about $1\times10^{17}$ cm$^{-3}$ to about $5\times10^{19}$ cm$^{-3}$. Then, an n-type dopant is implanted in the p-doped well 80 in the first region 62 of the substrate 60 to form an n+-doped source/drain region 82. Example species for implanting n-type dopants include arsenic (As), phosphorus (P), antimony (Sb), nitrogen (N), carbon (C), the like, or a combination thereof. A concentration of an n-type dopant in the n+-doped source/drain region 82 can be in a range from about $1\times10^{20}$ cm$^{-3}$ to about $7\times10^{21}$ cm$^{-3}$. The bottom layer 76 and the photoresist 78 can then be removed, such by as an appropriate ashing to remove the photoresist 78 and an etching to remove the bottom layer 76.

Figure 9:
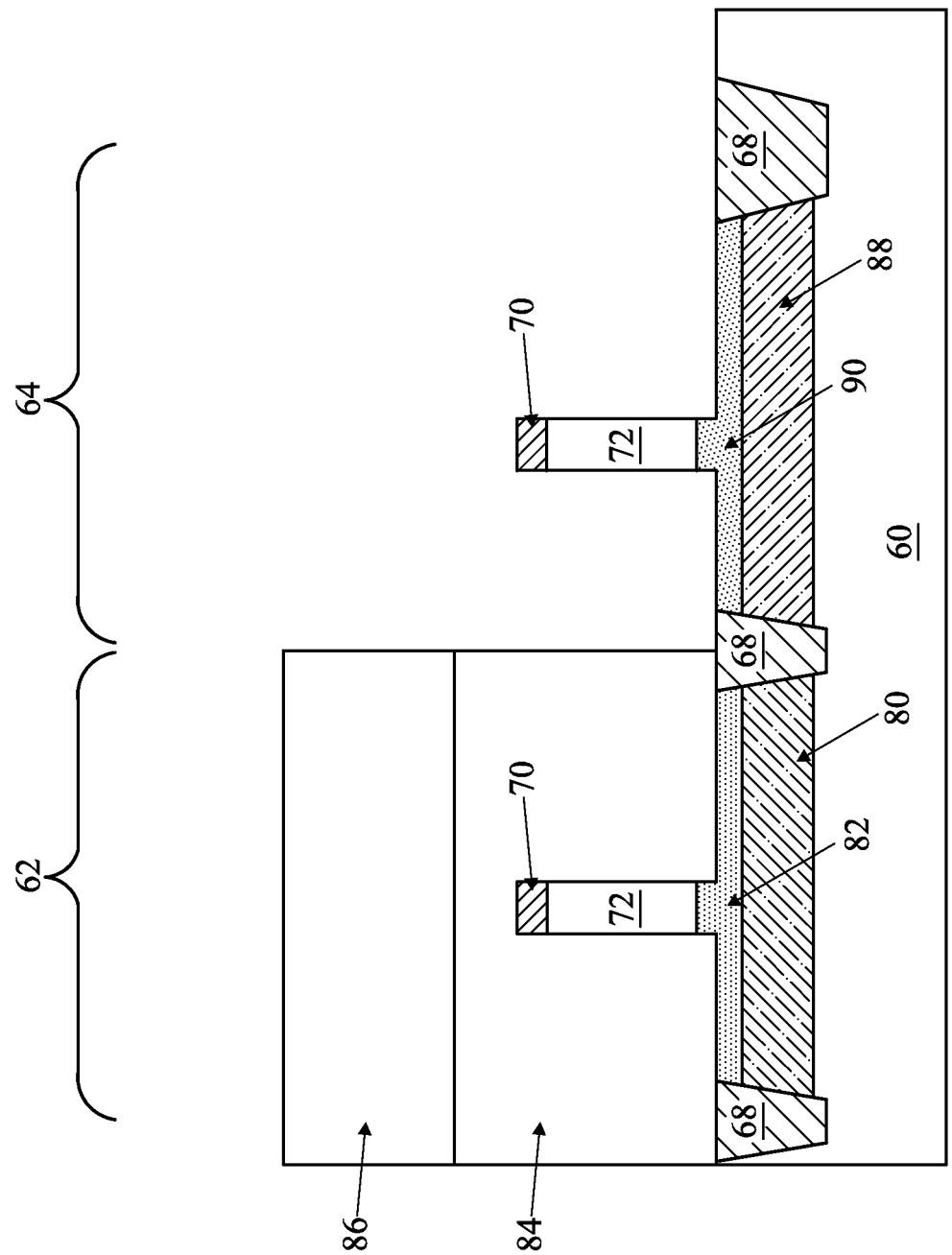

In FIG. 9, a bottom layer 84 and a photoresist 86 are formed on the first region 62 of the substrate 60. The bottom layer 84 may comprise a hard mask material such as silicon nitride, silicon carbide, silicon oxynitride, silicon carbon nitride, or the like formed by using CVD, PECVD, ALD, or the like. The bottom layer 84 may be planarized, such as by CMP. The bottom layer 84 can be initially formed in the first region 62 and the second region 64 of the substrate 60. The photoresist 86 is then formed and patterned on the bottom layer 84 in the second region 64. The photoresist 86 can be formed by using a spin-on technique and patterned using acceptable photolithography techniques. The portion of the bottom layer 84 in the second region 64 can then be removed, such as by etching, such as RIE or the like, using the photoresist 86 as a mask. The filler dielectric layer 74 can be removed from the second region 64 of the substrate 60 after the bottom layer 84 is removed. The bottom layer 84 can remain in the first region 62 of the substrate 60 while exposing the second region 64 of the substrate 60.

Once the bottom layer 84 and the photoresist 86 are formed, an n-type dopant is implanted in the second region 64 of the substrate 60 to form an n-doped well 88. Example species for implanting n-type dopants include arsenic (As), phosphorus (P), antimony (Sb), nitrogen (N), carbon (C), the like, or a combination thereof. A concentration of an n-type dopant in the n-doped well 88 can be in a range from about $1\times10^{17}$ cm$^{-3}$ to about $5\times10^{19}$ cm$^{-3}$. Then, a p-type dopant is implanted in the n-doped well 88 in the second region 64 of the substrate 60 to form a p+-doped source/drain region 90. Example species for implanting p-type dopants include boron (B), $BF_2$, indium (In), nitrogen (N), carbon (C), the like, or a combination thereof. A concentration of a p-type dopant in the p+-doped source/drain region 90 can be in a range from about $5\times10^{19}$ cm$^{-3}$ to about $5\times10^{21}$ cm$^{-3}$. The bottom layer 84 and the photoresist 86 can then be removed, such by as an appropriate ashing to remove the photoresist 86 and an etching to remove the bottom layer 84.

Figure 10:
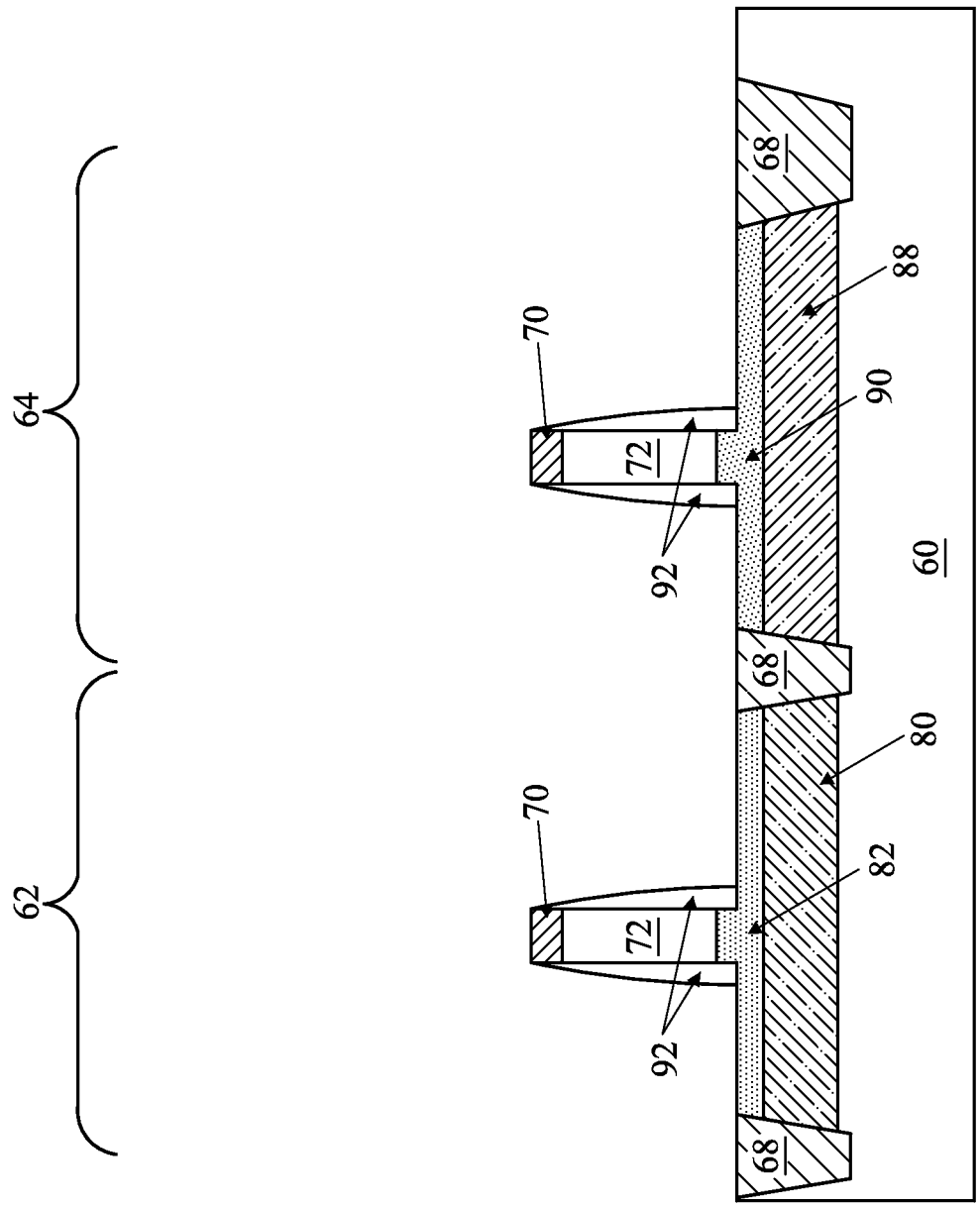

In FIG. 10, spacers 92 are formed around sidewalls of the vertical channel structures 72. In some embodiments, a spacer layer is conformally deposited over the substrate 60 and along the sidewalls of the vertical channel structures 72 such that the thickness of the spacer layer is substantially a same thickness throughout the layer. In some embodiments, the spacer layer is made of SiN, SiON, SiC, SiCN, SiOCN, the like, or a combination thereof. The spacer layer may be deposited using an appropriate deposition process, such as ALD, CVD, PVD, the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the spacers 92 around and along the sidewalls of the vertical channel structures 72.

Figure 11:
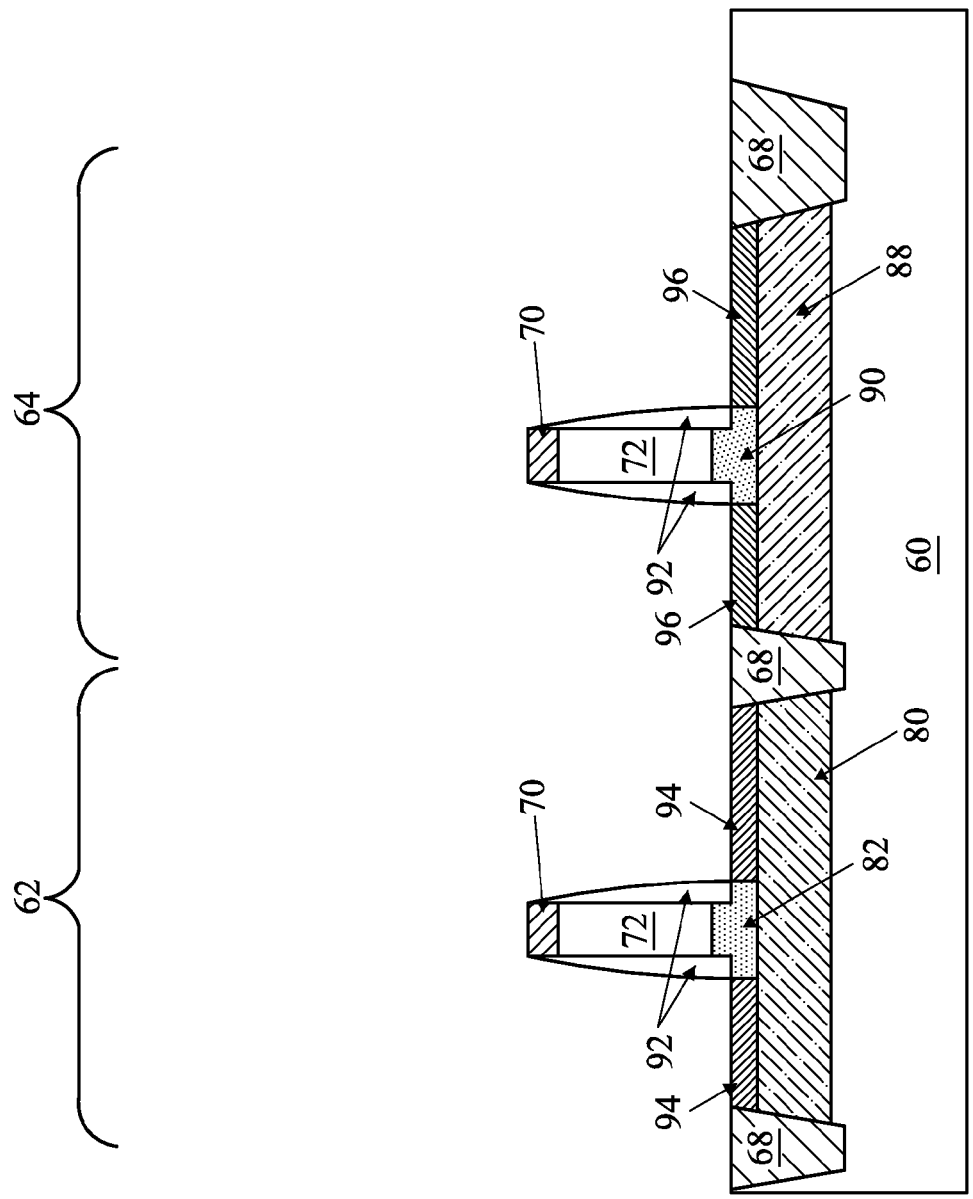

In FIG. 11, a metal-semiconductor compound region 94 in the first region 62 and a metal-semiconductor compound region 96 in the second region 64 are formed. The metal-semiconductor compound regions 94 and 96 can be formed by depositing a metal on the substrate 60 and reacting the metal with a semiconductor, such as the semiconductor material of the substrate 60. In some embodiments, the metal can include cobalt, titanium, nickel, tungsten, the like, or a combination thereof, and can be deposited by Physical Vapor Deposition (PVD), ALD, CVD, the like, or a combination thereof. The metal can be caused to react with the semiconductor by using an anneal. Any unreacted metal that remains after the anneal can be removed using an etch selective to the material of the unreacted metal. The metal-semiconductor compound regions 94 and 96 can include CoSi, TiSi, NiSi, WSi, the like, or a combination thereof. The spacers 92 and mask caps 70 prevent the metal from reacting with the semiconductor material of the vertical channel structures 72 during the anneal. The metal-semiconductor compound regions 94 and 96 are formed on the exposed portions of semiconductor material of the substrate 60 in the first region 62 and the second region 64. As illustrated, the metal-semiconductor compound regions 94 and 96 are formed in, and consume, the entireties of the exposed portions of source/drain regions 82 and 90, respectively, that are not under or protected by the spacers 92. In other embodiments, the metal-semiconductor compound regions 94 and 96 can be formed to a greater or lesser extent in the substrate 60. In other embodiments, other conductive features can be used instead of or in combination with the metal-semiconductor compound regions 94 and 96. For example, in the first region 62, an epitaxially grown material may be used, such as SiP, SiC, SiPC, Si, Ge, a III-V material, a combination thereof, or the like. For example, in the second region 64, an epitaxially grown material may be used, such as SiGe, Ge, a Ge-containing material, SiP, SiC, a III-V material, a combination thereof, or the like.

Figure 12:
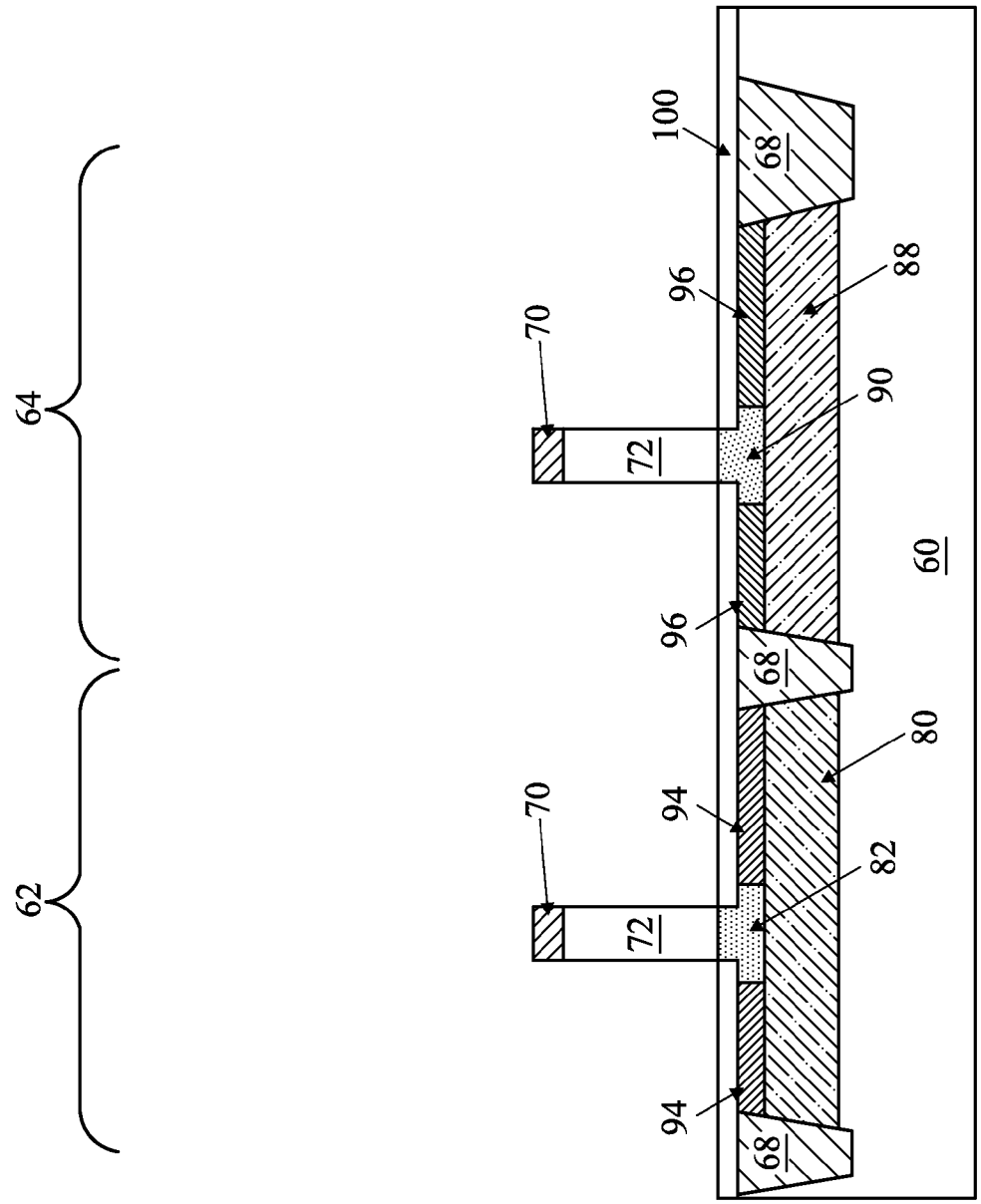

In FIG. 12, a first dielectric layer 100 is formed on the substrate 60 and around the vertical channel structures 72. The first dielectric layer 100 can comprise silicon nitride, SiCN, or the like deposited by CVD, PECVD, ALD, or the like. In some embodiments, the first dielectric layer 100 is deposited with a thickness greater than heights of the vertical channel structures 72. A planarization process, such as a CMP, is then performed to form top surfaces of the mask caps 70 to be co-planar with a top surface of the first dielectric layer 100. Subsequently, a controlled etch back, such as an anisotropic etch, etches the first dielectric layer 100 to an appropriate thickness. The first dielectric layer 100 may serve various purposes, such as an etch stop layer for forming contacts to the metal-semiconductor compound regions 94 and 96 and/or as a gate spacer.

Although not illustrated, channel implants may be performed to dope the vertical channel structures 72. The implantation process may include masking regions, such as discussed above with respect to FIGS. 8 and 9. An n-type dopant can be implanted in the vertical channel structure 72 in the second region 64 of the substrate 60 to form an n-doped channel. Example species for implanting n-type dopants include arsenic (As), phosphorus (P), antimony (Sb), germanium (Ge), nitrogen (N), carbon (C), the like, or a combination thereof. A concentration of an n-type dopant in the n-doped channel can be in a range from about $1\times10^{12}$ cm$^{-3}$ to about $5\times10^{13}$ cm$^{-3}$. A p-type dopant can be implanted in the vertical channel structure 72 in the first region 62 of the substrate 60 to form a p-doped channel. Example species for implanting p-type dopants include boron (B), BF$_2$, indium (In), germanium (Ge), nitrogen (N), carbon (C), the like, or a combination thereof. A concentration of a p-type dopant in the p-doped channel can be in a range from about $1\times10^{12}$ cm$^{-3}$ to about $5\times10^{13}$ cm$^{-3}$.

Figure 13:
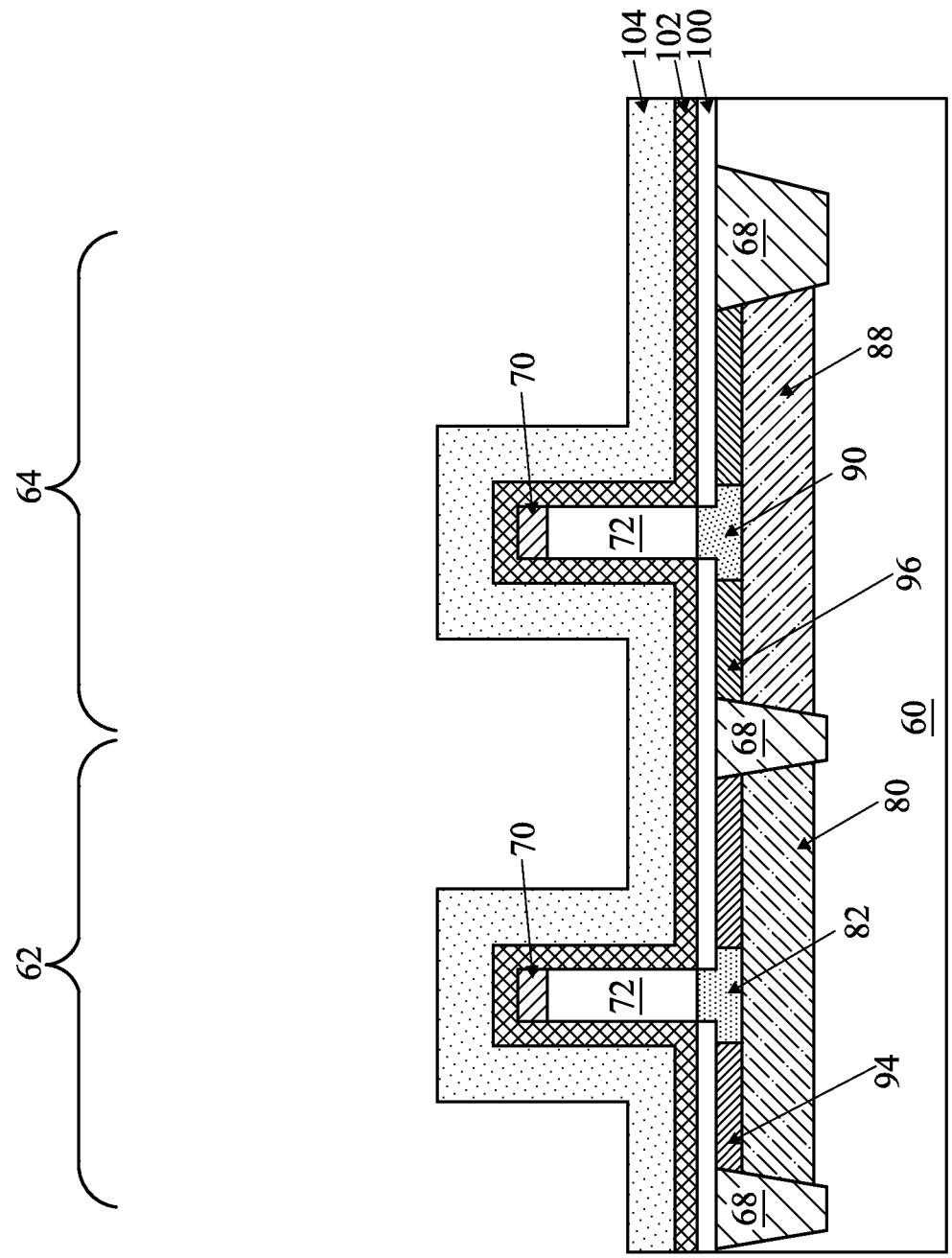
Figure 14:
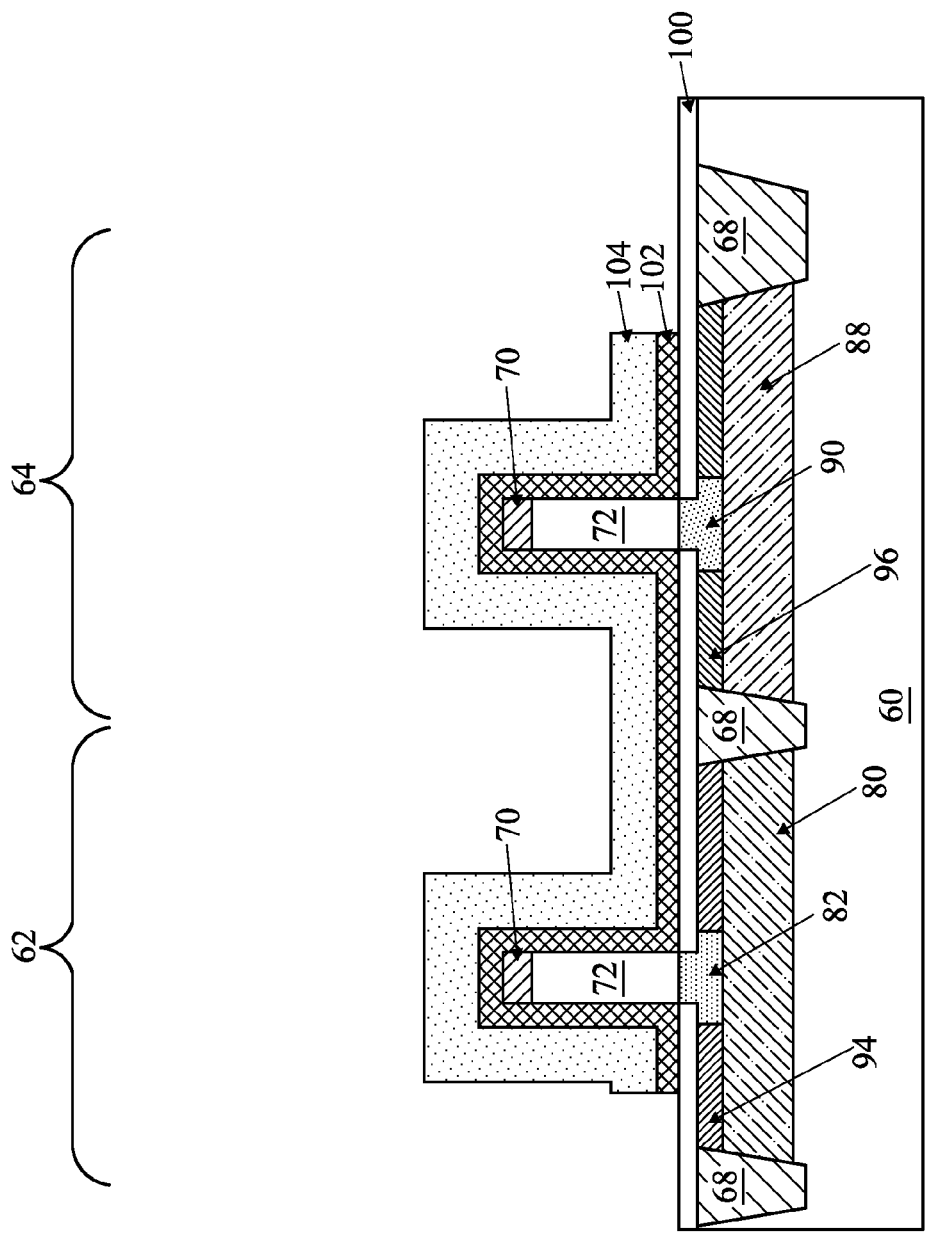

In FIG. 13, gate dielectric layer 102 and gate electrode layer 104 are formed. Gate dielectric layer 102 is deposited conformally on the vertical channel structures 72, such as over the top surfaces of the mask caps 70 and along the sidewalls of the vertical channel structures 72. In accordance with some embodiments, gate dielectric layer 102 comprises silicon oxide, silicon nitride, or multilayers thereof. In other embodiments, gate dielectric layer 102 comprises a high-k dielectric material, and in these embodiments, gate dielectric layer 102 may have a k value greater than about 7.0, or further, greater than about 10.0. A high-k dielectric material may include SiON, Si$_3$N$_4$, Ta$_2$O$_5$, Al$_2$O$_3$, a Hf oxide, a Ta oxide, an Al oxide, the like, and a combination thereof. The formation methods of gate dielectric layer 102 may include Molecular Beam Deposition (MBD), ALD, PECVD, the like, or a combination thereof. Next, gate electrode layer 104 is deposited over gate dielectric layer 102. The gate electrode layer 104 may comprise a metal-containing material such as TiN, TaN, TiAl, TaAl, a Ti-containing material, a Ta-containing material, an Al-containing material, a W-containing material, TiSi, NiSi, PtSi, polysilicon with a silicide, a Cu-containing material, a refractory material, the like, combinations thereof, or multi-layers thereof. In FIG. 14, the gate electrode layer 104 and the gate dielectric layer 102 are patterned, such as by using an acceptable photolithography and etching process, such as RIE or the like.

Figure 15:
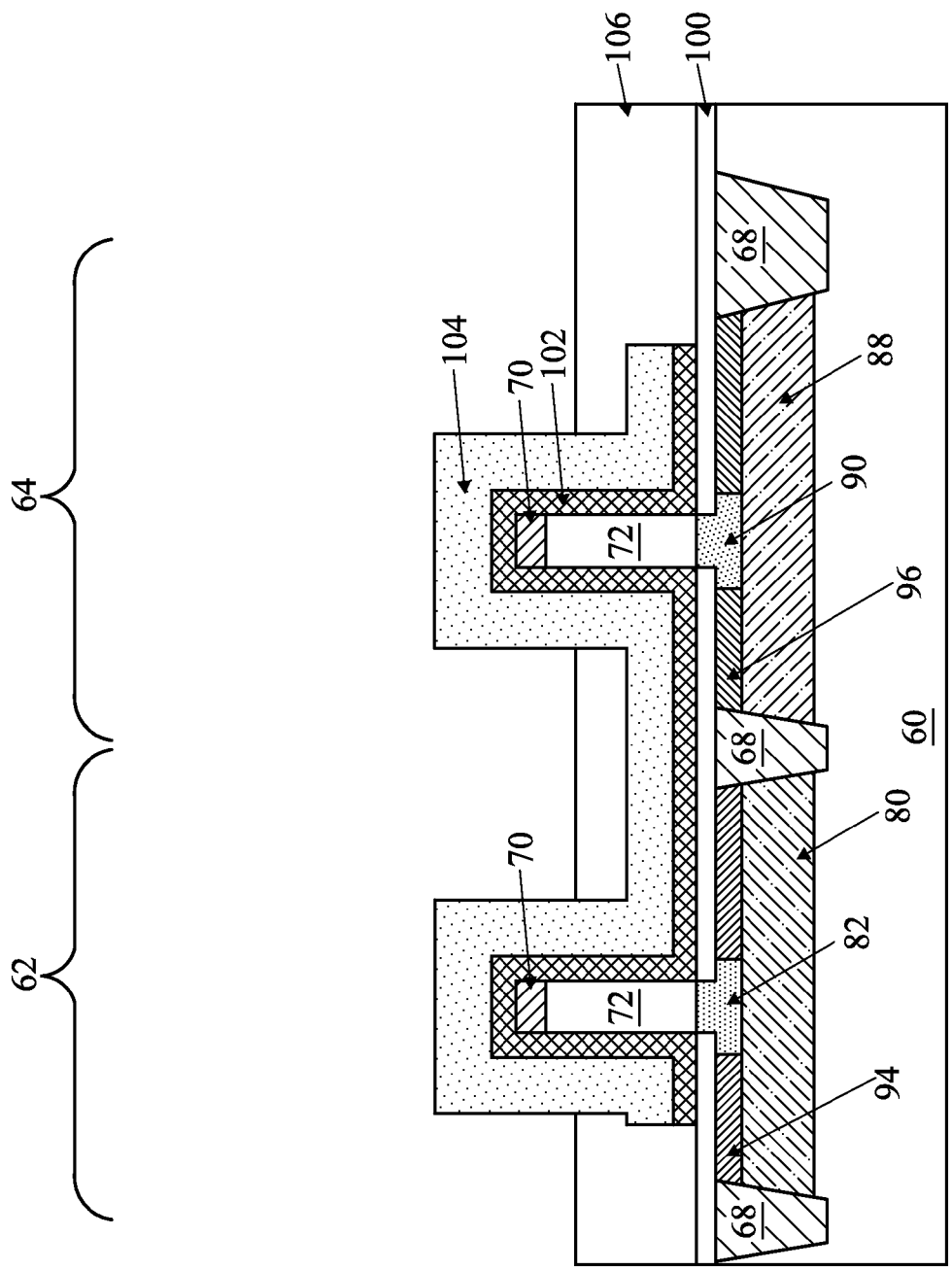

In FIG. 15, a second dielectric layer 106 is formed on the first dielectric layer 100 and the gate electrode layer 104 and around the vertical channel structures 72. The second dielectric layer 106 may comprise silicon oxide, tetraethyl orthosilicate (TEOS), PSG, BPSG, fluorinated silicate glass (FSG), SiO$_x$C$_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. In some embodiments, the second dielectric layer 106 is deposited with a thickness greater than heights of the gate electrode layer 104. A planarization process, such as a CMP, is then performed to form top surfaces of the gate electrode layer 104 to be co-planar with a top surface of the second dielectric layer 106. Subsequently, a controlled etch back, such as an anisotropic etch, etches the second dielectric layer 106 to an appropriate thickness. The second dielectric layer 106 may serve various purposes, such as an Inter-Layer Dielectric (ILD).

Figure 16:
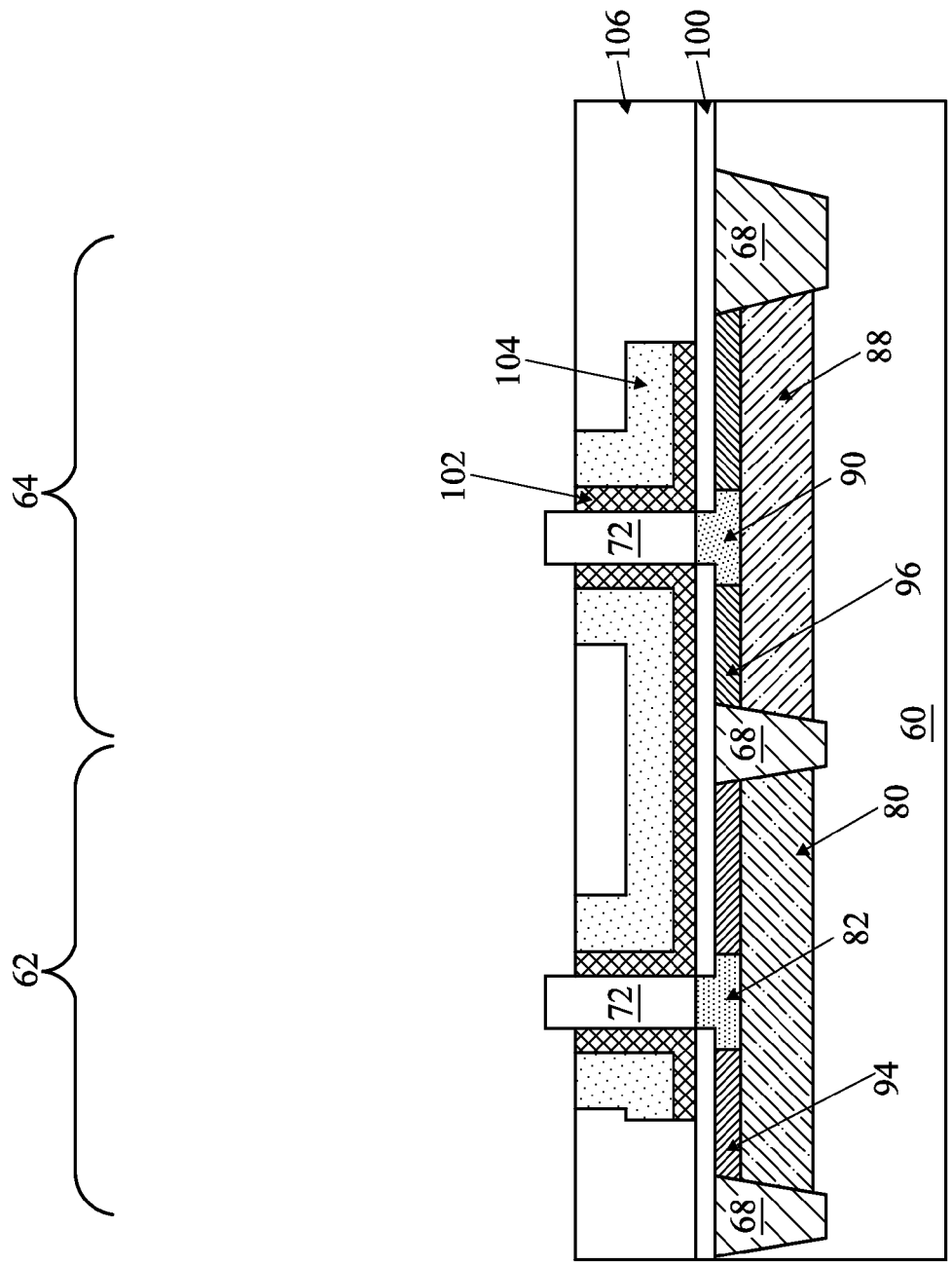

In FIG. 16, the gate electrode layer 104 and the gate dielectric layer 102 are etched back, and the mask caps 70 are removed from over the vertical channel structures 72. The gate electrode layer 104 and the gate dielectric layer 102 can be etched back using a controlled etch back that uses an appropriate etch process, such as an anisotropic or isotropic etch selective to the materials of the gate electrode layer 104 and the gate dielectric layer 102. After etching back the gate electrode layer 104 and the gate dielectric layer 102, the mask caps 70 are removed, such as by using an appropriate etching process selective to the material of the mask caps 70. After the etch backs of the second dielectric layer 106, the gate electrode layer 104, and the gate dielectric layer 102, the vertical channel structures 72 protrude from and above each of the second dielectric layer 106, gate electrode layer 104, and gate dielectric layer 102.

Figure 17:
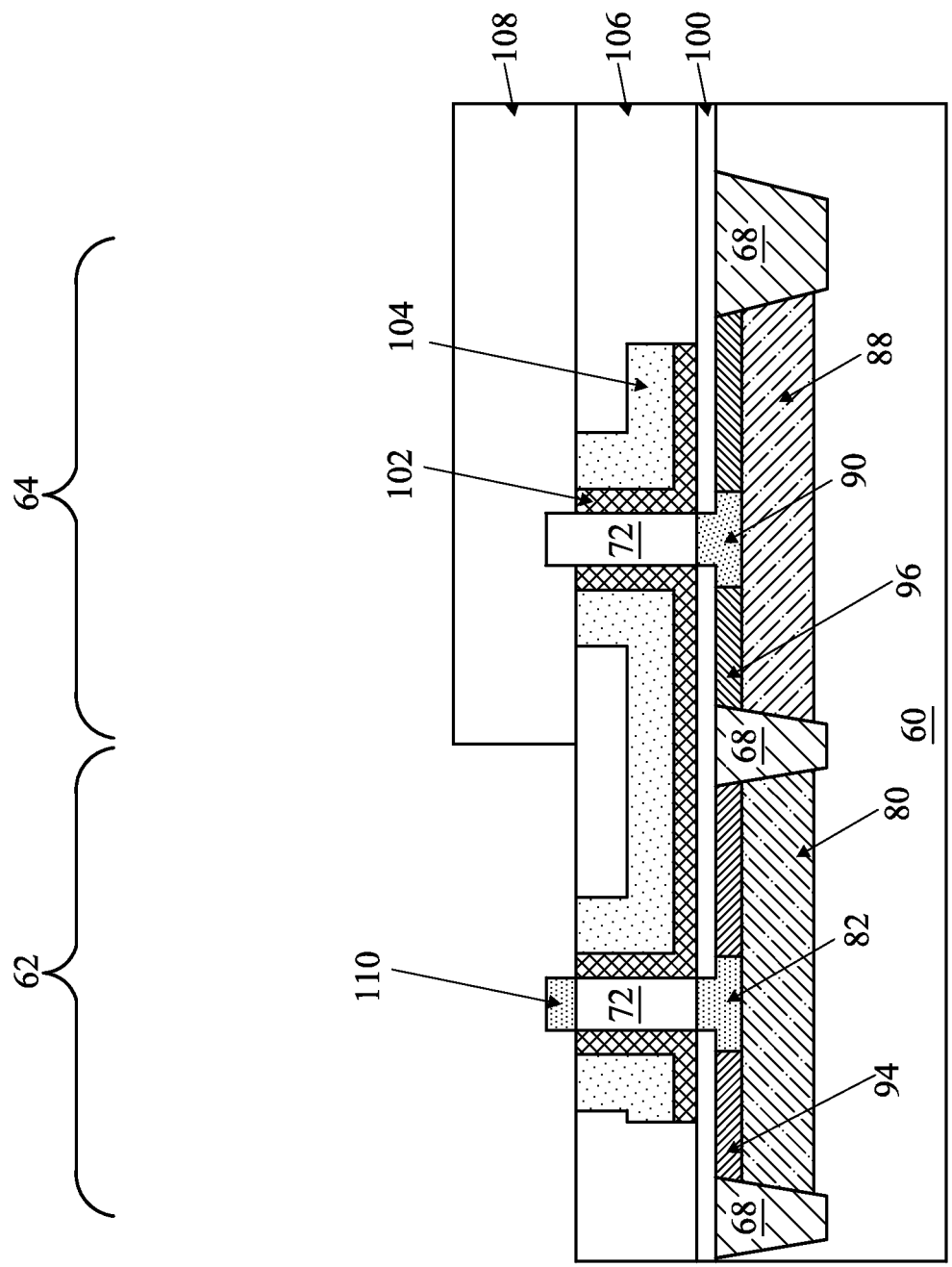

In FIG. 17, a photoresist 108 is formed on the second dielectric layer 106, the gate electrode layer 104, the gate dielectric layer 102, and the vertical channel structure 72 in the second region 64 of the substrate 60. The photoresist 108 can be formed by using a spin-on technique and patterned using acceptable photolithography techniques. Once the photoresist 108 is formed, an n-type dopant is implanted in the first region 62 of the substrate 60. The n-type dopant is implanted in the vertical channel structure 72 in the first region 62 of the substrate 60 to form an n+-doped source/drain region 110 in the portion of the vertical channel structure 72 in the first region 62 that protrudes above the second dielectric layer 106, the gate electrode layer 104, and the gate dielectric layer 102. Example species for implanting n-type dopants include arsenic (As), phosphorus (P), antimony (Sb), nitrogen (N), carbon (C), the like, or a combination thereof. A concentration of an n-type dopant in the n+-doped source/drain region 110 can be in a range from about $1\times10^{20}$ cm$^{-3}$ to about $7\times10^{21}$ cm$^{-3}$. The photoresist 108 can then be removed, such by as an appropriate ashing.

Figure 18:
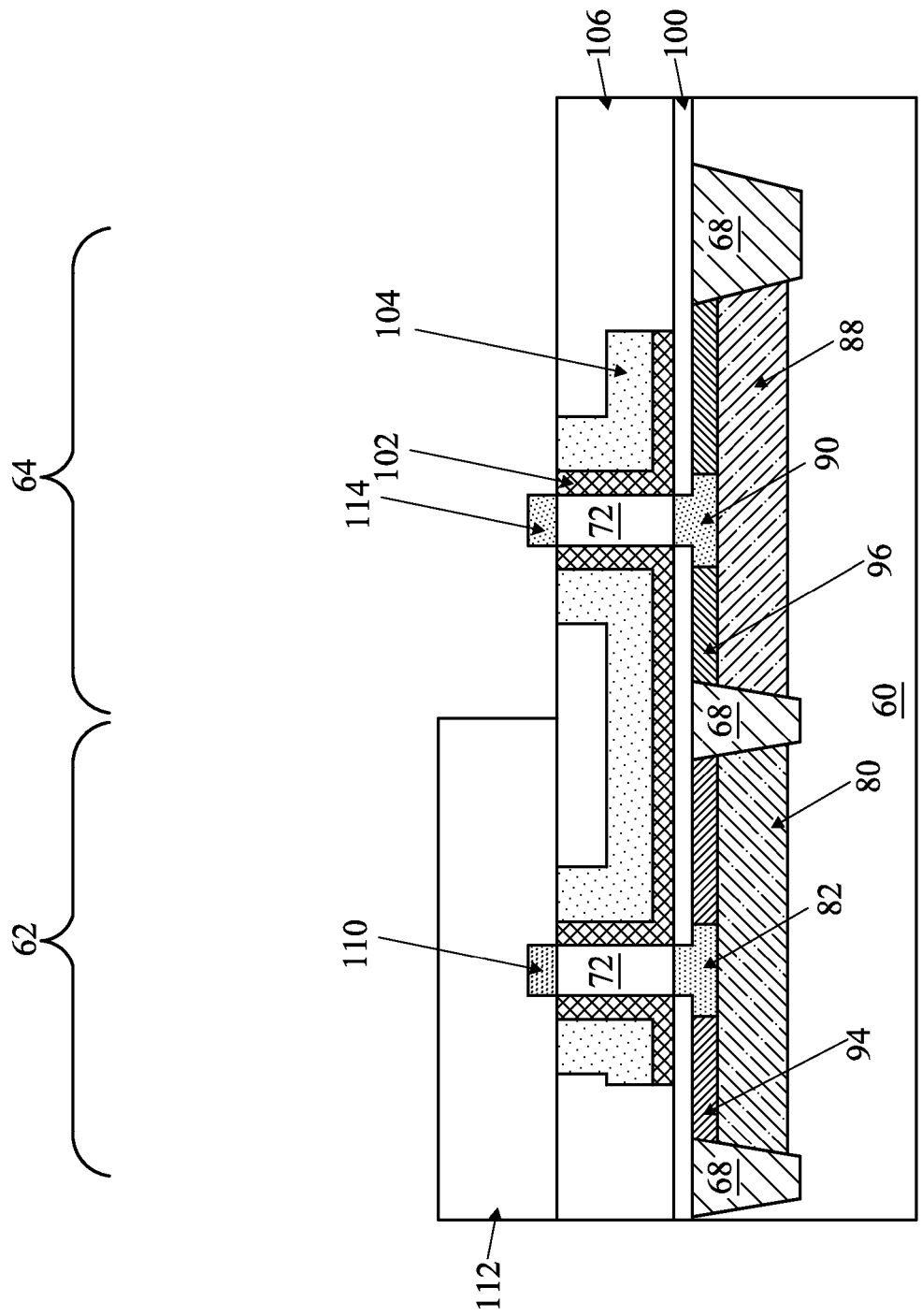

In FIG. 18, a photoresist 112 is formed on the second dielectric layer 106, the gate electrode layer 104, the gate dielectric layer 102, and the vertical channel structure 72 in the first region 62 of the substrate 60. The photoresist 112 can be formed by using a spin-on technique and patterned using acceptable photolithography techniques. Once the photoresist 112 is formed, a p-type dopant is implanted in the second region 64 of the substrate 60. The p-type dopant is implanted in the vertical channel structure 72 in the second region 64 of the substrate 60 to form a p+-doped source/drain region 114 in the portion of the vertical channel structure 72 in the second region 64 that protrudes above the second dielectric layer 106, the gate electrode layer 104, and the gate dielectric layer 102. Example species for implanting p-type dopants include boron (B), BF$_2$, indium (In), nitrogen (N), carbon (C), the like, or a combination thereof. A concentration of a p-type dopant in the p+-doped source/drain region 114 can be in a range from about $5\times10^{19}$ cm$^{-3}$ to about $5\times10^{21}$ cm$^{-3}$. The photoresist 112 can then be removed, such by as an appropriate ashing.

Figure 19:
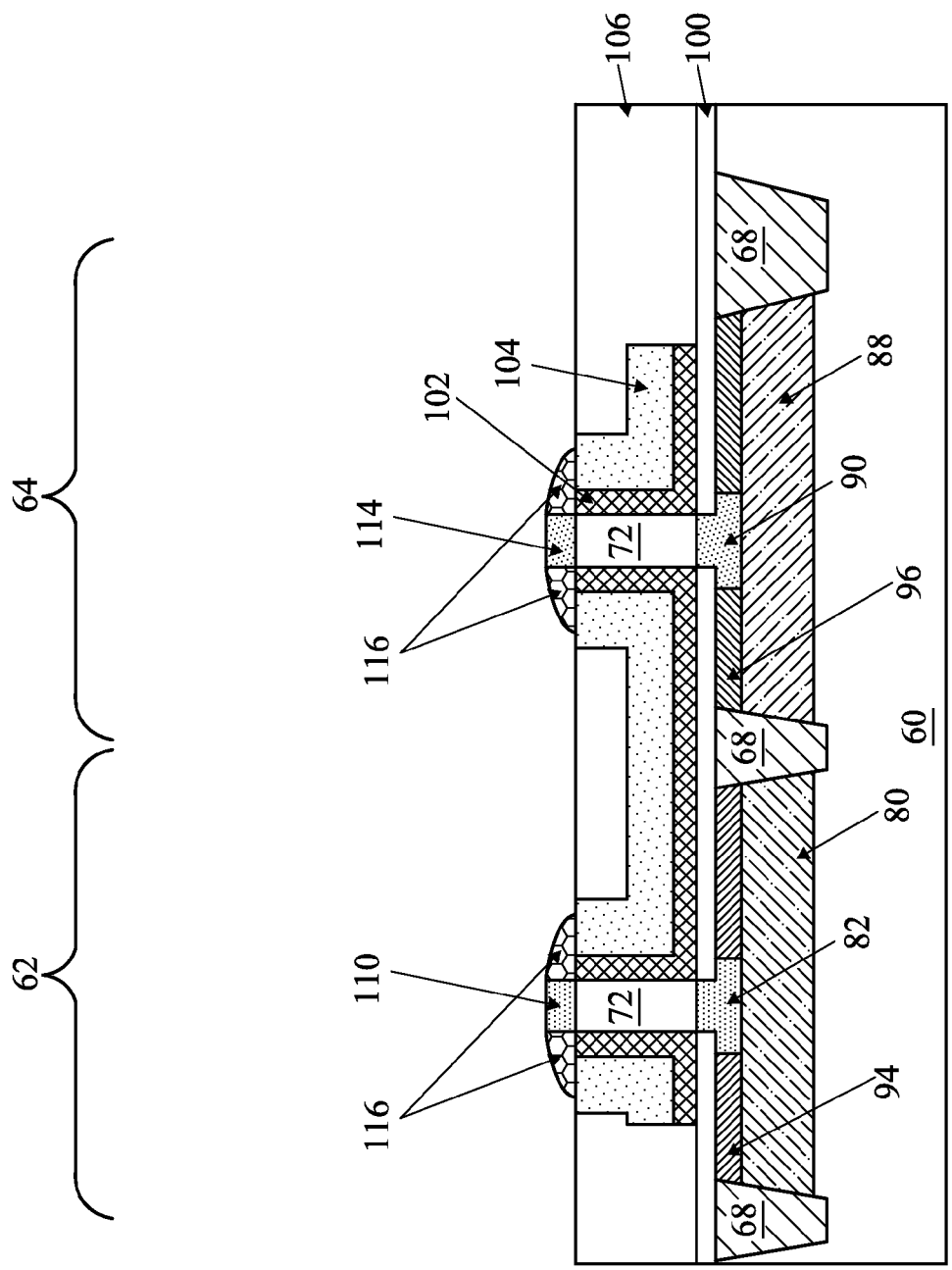

In FIG. 19, spacers 116 are formed around and along sidewalls of the portions of the vertical channel structures 72 that protrude above the second dielectric layer 106, the gate electrode layer 104, and the gate dielectric layer 102. In some embodiments, a spacer layer is conformally deposited over the second dielectric layer 106, the gate electrode layer 104, and the gate dielectric layer 102, and the vertical channel structures 72 and along the sidewalls of the vertical channel structures 72 such that the thickness of the spacer layer is substantially a same thickness throughout the layer. In some embodiments, the spacer layer is made of SiN, SiON, SiC, SiCN, SiOCN, the like, or a combination thereof. The spacer layer may be deposited using an appropriate deposition process, such as ALD, CVD, PVD, the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the spacers 116 around and along the sidewalls of the vertical channel structures 72 that protrude above the second dielectric layer 106, the gate electrode layer 104, and the gate dielectric layer 102.

Figure 20:
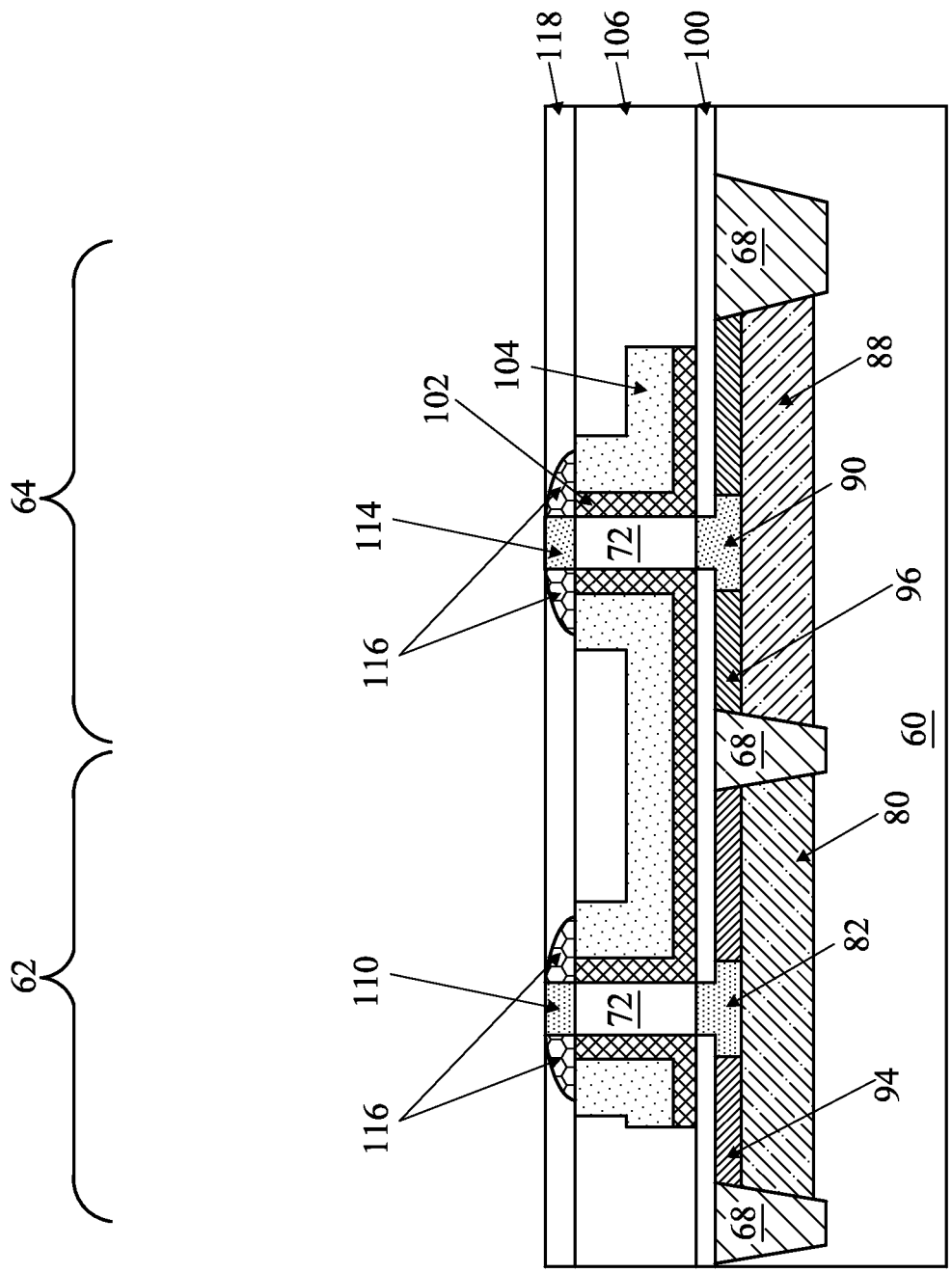

In FIG. 20, a third dielectric layer 118 is formed on the second dielectric layer 106 and the spacers 116 and around the vertical channel structures 72. The third dielectric layer 118 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. In some embodiments, the third dielectric layer 118 is deposited with a thickness greater than heights of the vertical channel structures 72. A planarization process, such as a CMP, is then performed to form top surfaces of the vertical channel structures 72 to be co-planar with a top surface of the third dielectric layer 118. This can cause the source/drain regions 110 and 114 of the vertical channel structures 72 to be exposed through the third dielectric layer 118.

Figure 21:
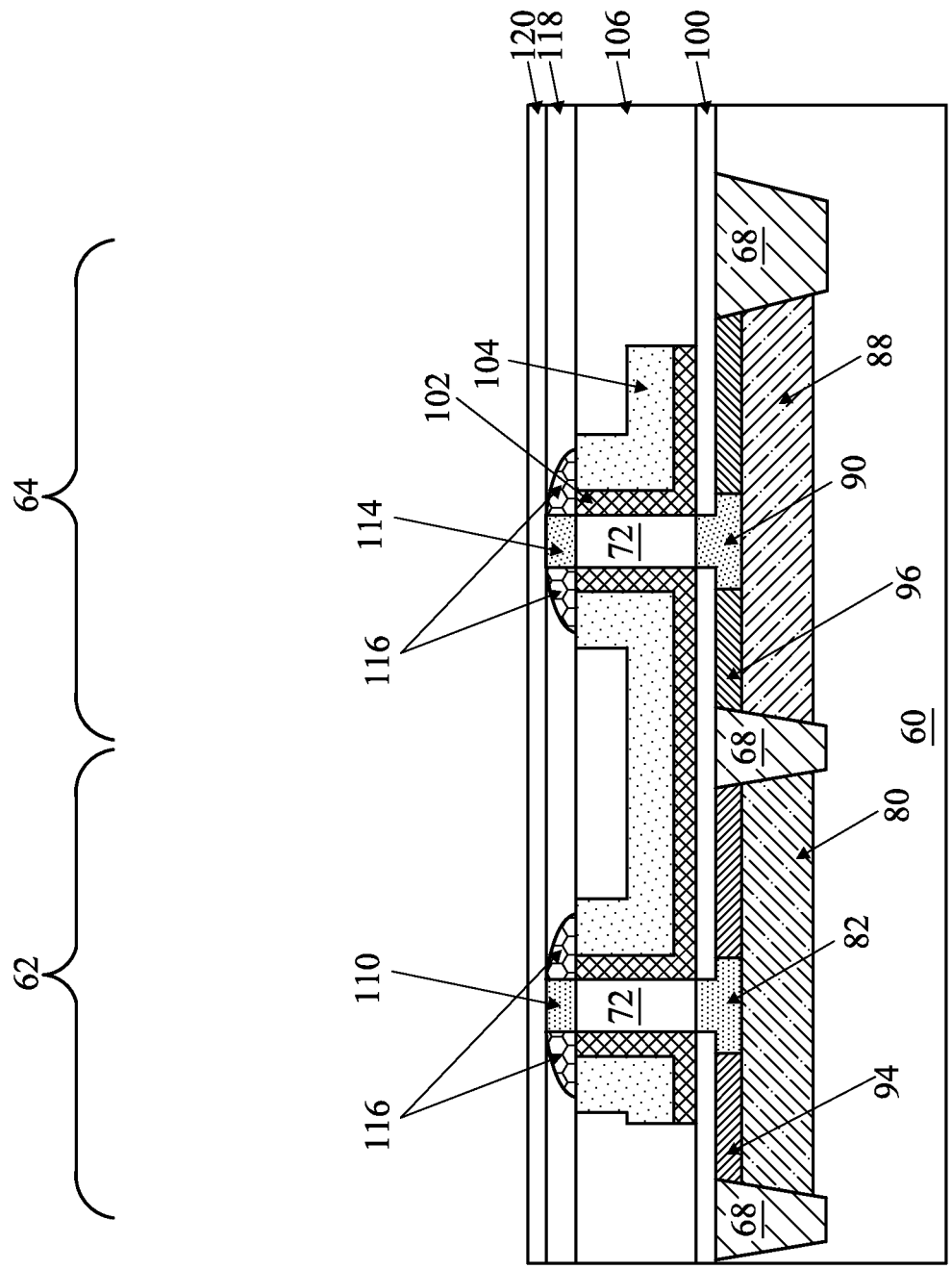

In FIG. 21, a semiconductor layer 120 is formed over the third dielectric layer 118 and on the exposed surfaces of the vertical channel structures 72. The semiconductor layer 120 can be silicon, such as amorphous or polycrystalline, or the like. The semiconductor layer 120 can be formed using any suitable method, such as CVD, PECVD, the like, or a combination thereof.

Figure 22:
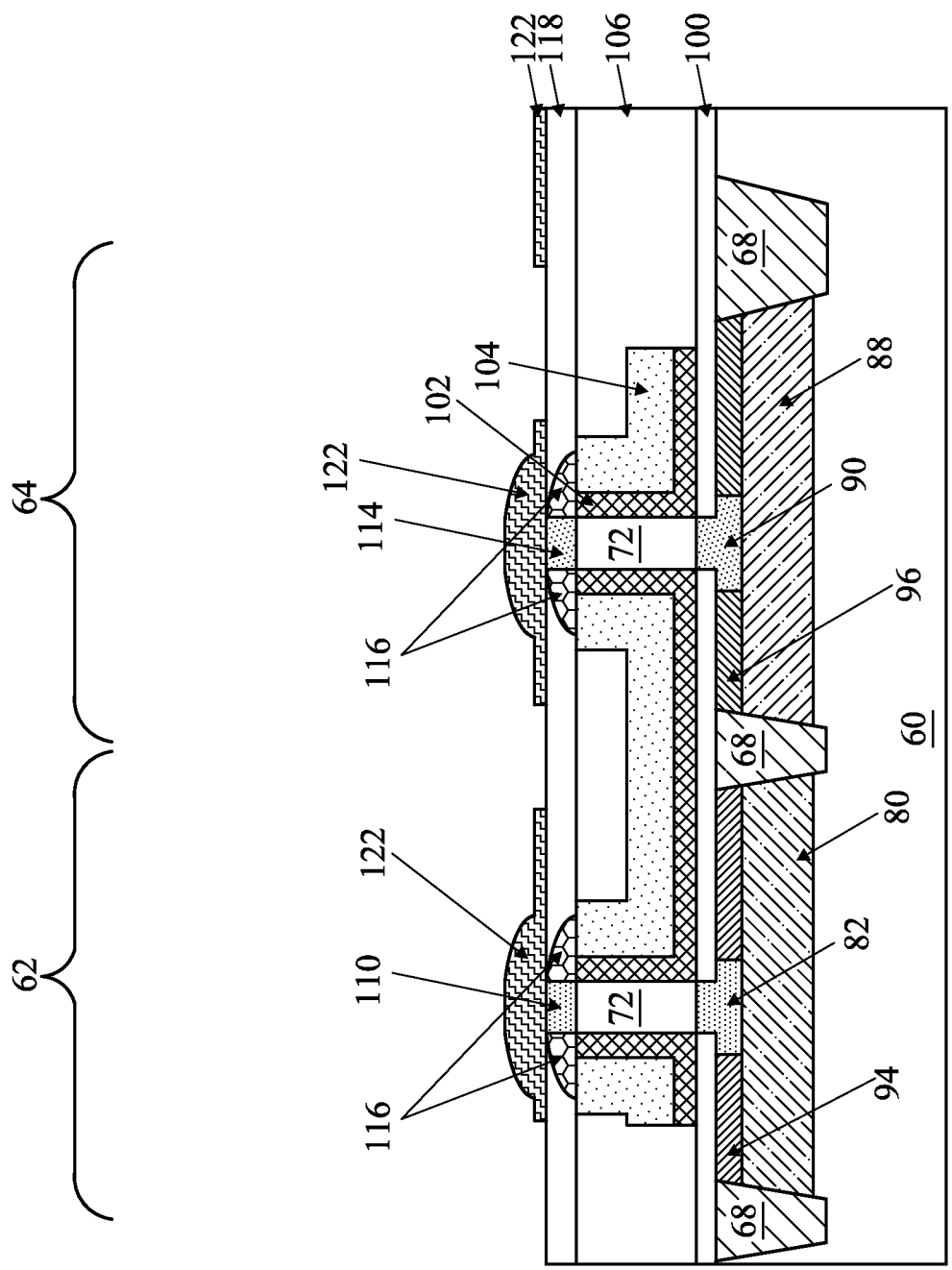

In FIG. 22, metal-semiconductor compound regions 122 are formed over the third dielectric layer 118 and on the exposed surfaces of the vertical channel structures 72. In some embodiments, the semiconductor layer 120 is patterned to correspond to the metal-semiconductor compound regions 122. Then, a metal can be deposited on remaining portions of the semiconductor layer 120 and on the third dielectric layer 118. The metal can be reacted with the remaining portions of the semiconductor layer 120. In some embodiments, the metal can include cobalt, titanium, nickel, tungsten, the like, or a combination thereof, and can be deposited by PVD, ALD, CVD, the like, or a combination thereof. The metal can be caused to react with the semiconductor layer 120 by using an anneal. Any unreacted metal that remains after the anneal can be removed using an etch selective to the material of the unreacted metal. The metal-semiconductor compound regions 122 can include CoSi, TiSi, NiSi, PtSi, MoSi, WSi, the like, or a combination thereof. In other embodiments, other conductive features can be used instead of or in combination with the metal-semiconductor compound regions 122, such as a semiconductor which may be doped; a metal such as W, Cu, and Al; a metal-alloy such as TiN and TaN; the like, or a combination thereof.

Figure 23:
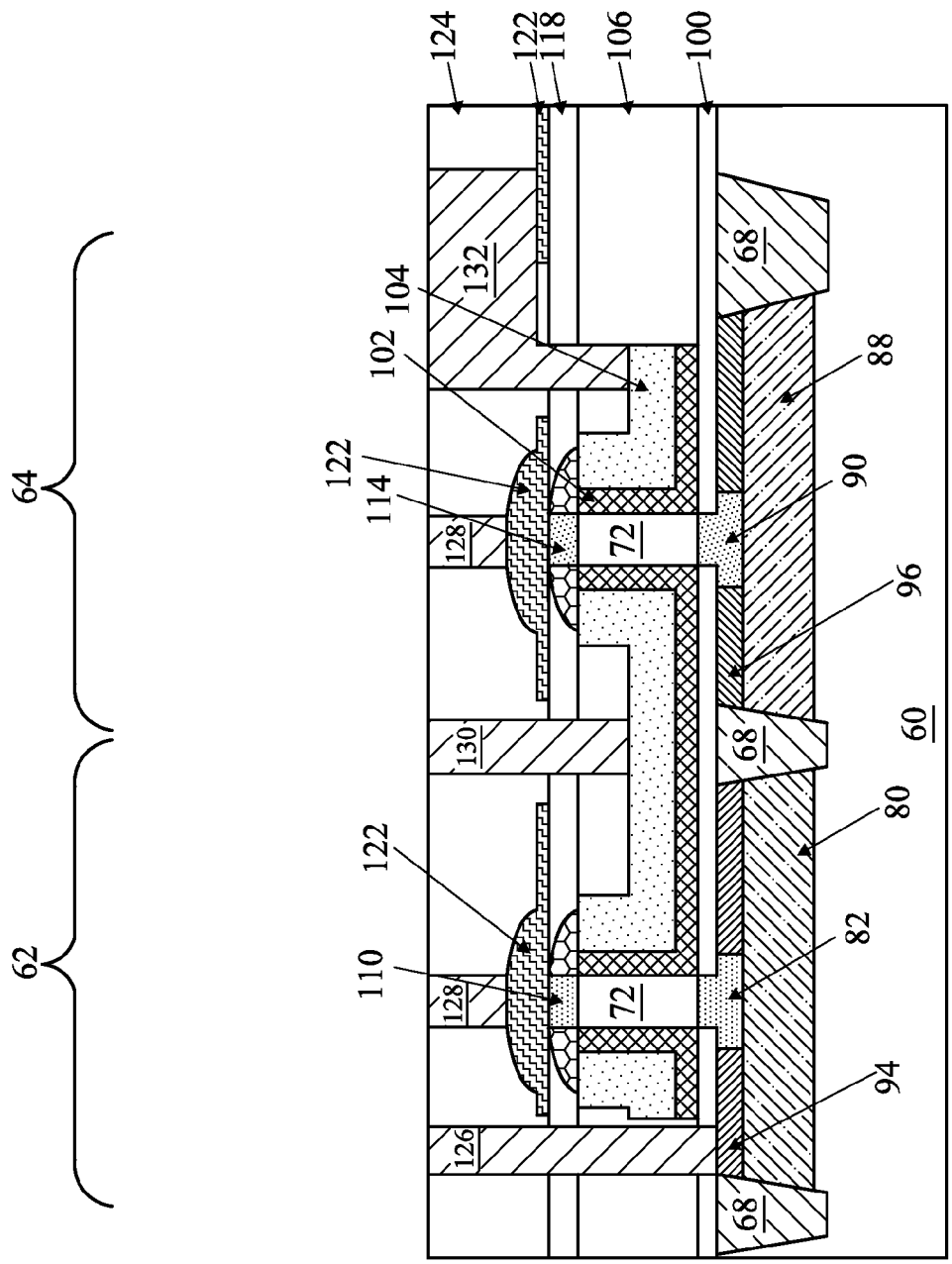

In FIG. 23, a fourth dielectric layer 124, such as an ILD, is formed over the third dielectric layer 118 and the metal-semiconductor compound regions 122, and contacts 126, 128, 130, and 132 are formed through various dielectric layers to various components. The fourth dielectric layer 124 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the second dielectric layer 106.

Openings for the contacts 126, 128, 130, and 132 can be formed using one or more etching steps. An opening for contact 126 is etched through the fourth dielectric layer 124, third dielectric layer 118, second dielectric layer 106, and first dielectric layer 100 to the metal-semiconductor compound region 94. Openings for contacts 128 are etched through the fourth dielectric layer 124 to respective metal-semiconductor compound regions 122. An opening for contact 130 is etched through the fourth dielectric layer 124, third dielectric layer 118, and second dielectric layer 106 to the gate electrode layer 104. An opening for contact 132 may be etched in a multi-step process through the fourth dielectric layer 124, third dielectric layer 118, and second dielectric layer 106 to the metal-semiconductor compound region 122 and the gate electrode layer 104. The openings may be formed using acceptable photolithography and etching techniques.

A liner, such as a diffusion barrier layer, an adhesion layer, or the like, and a conductive material are formed in the openings. The liner may include titanium, titanium nitride, tantalum, tantalum nitride, or the like formed by ALD, CVD, or the like. The conductive material may be copper, a copper alloy, silver, gold, tungsten, aluminum, nickel, or the like formed by ALD, CVD, PVD, or the like. A planarization process, such as a CMP, may be performed to remove excess material from a surface of the fourth dielectric layer 124. The remaining liner and conductive material form contacts 126, 128, 130, and 132 in the openings. Contact 126 is physically and electrically coupled to the metal-semiconductor compound region 94. Contacts 128 are physically and electrically coupled to respective metal-semiconductor compound regions 122. Contact 130 is physically and electrically coupled to the gate electrode layer 104. Contact 132 is physically and electrically coupled to the metal-semiconductor compound region 122 and the gate electrode layer 104. Contact 126 may be referred to as an active area contact. Contacts 128 may be referred to as top plate contacts. Contact 130 may be referred to as a gate contact. Contact 132 may be referred to as a local connection contact.

Figure 24A:
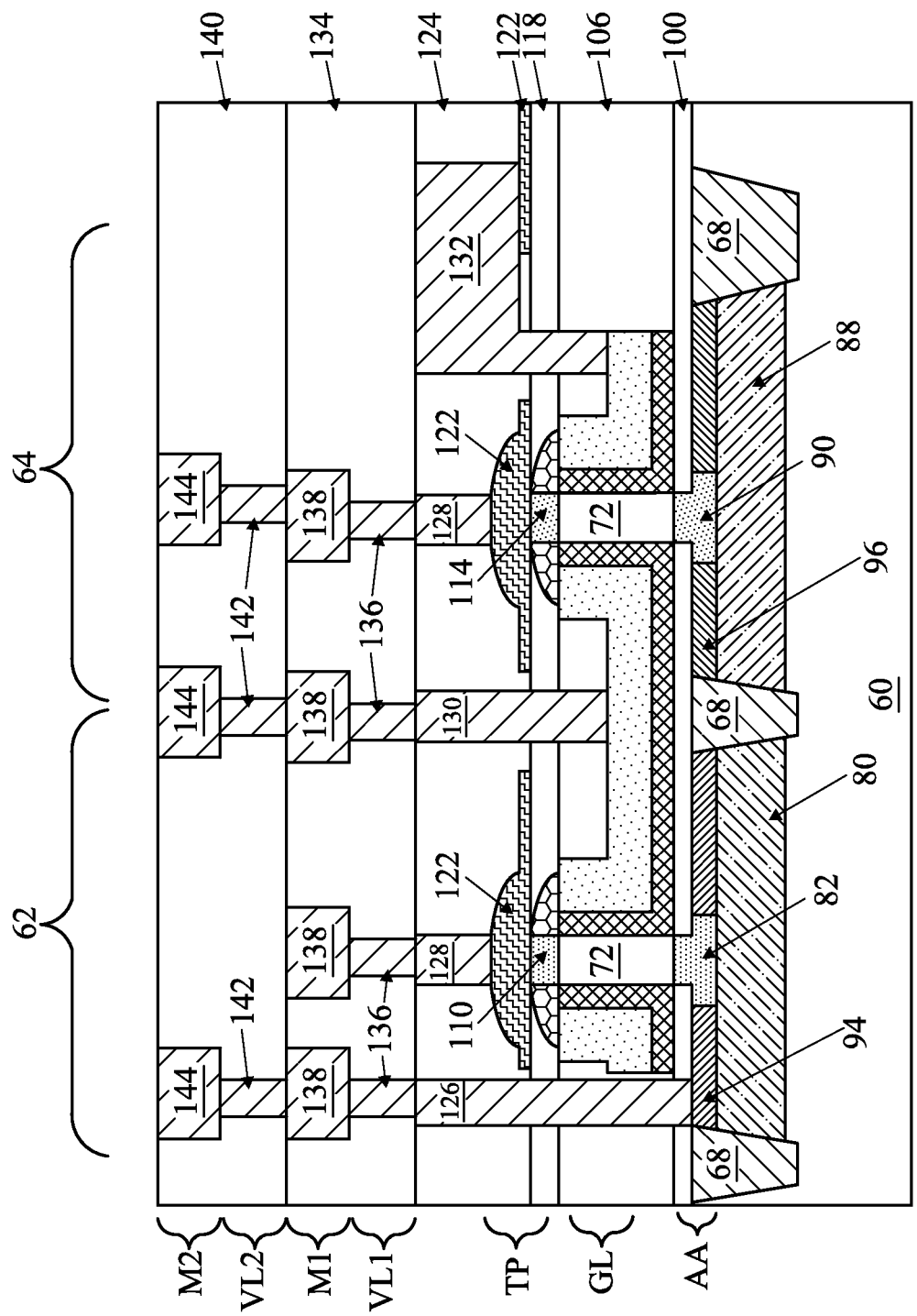
Figure 24B:
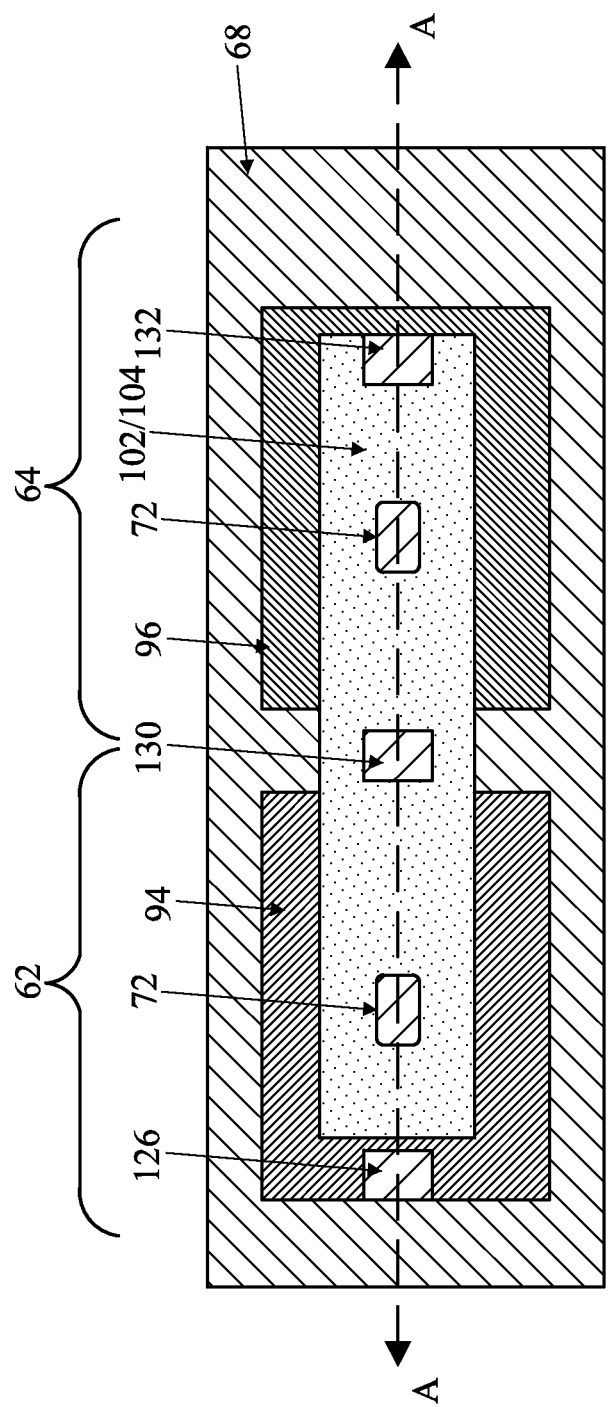
FIGS. 24B and 24C are overlaid layout views of VGAA device structures formed by the process discussed with respect to FIGS. 2 through 24A in accordance with some embodiments.
Figure 24C:
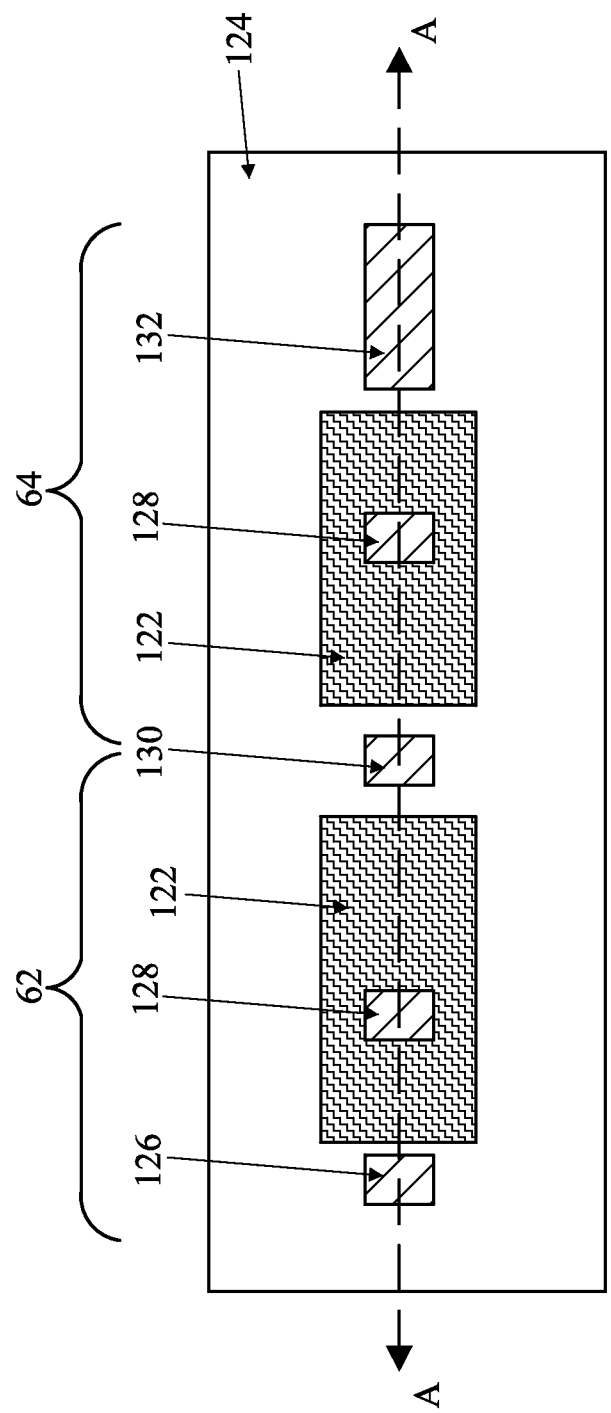

In FIG. 24A, a fifth dielectric layer 134 and a sixth dielectric layer 140 are formed with metallizations 138 and 144 and vias 136 and 142, respectively. The fifth dielectric layer 134, such as an Inter-Metallization Dielectric (IMD), is formed over the fourth dielectric layer 124. The fifth dielectric layer 134 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the fifth dielectric layer 134.

Openings and recesses corresponding to the vias 136 and metallization 138 are then formed in the fifth dielectric layer 134. The openings and recesses may be formed using acceptable photolithography and etching techniques. A liner, such as a diffusion barrier layer, an adhesion layer, or the like, and a conductive material are formed in the openings and recesses. The liner may include titanium, titanium nitride, tantalum, tantalum nitride, or the like formed by ALD, CVD, or the like. The conductive material can be copper, a copper alloy, silver, gold, tungsten, aluminum, or the like formed by ALD, CVD, PVD, plating, or the like. A planarization process, such as CMP, may be performed to remove any excess material from the top surface of the fifth dielectric layer 134. Remaining portions of the liner and the conductive material form the vias 136 and metallization 138.

The sixth dielectric layer 140, such as an IMD, is formed over the fifth dielectric layer 134. The sixth dielectric layer 140 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the sixth dielectric layer 140.

Openings and recesses corresponding to the vias 142 and metallization 144 are then formed in the sixth dielectric layer 140. The openings and recesses may be formed using acceptable photolithography and etching techniques. A liner, such as a diffusion barrier layer, an adhesion layer, or the like, and a conductive material are formed in the openings and recesses. The liner may include titanium, titanium nitride, tantalum, tantalum nitride, or the like formed by ALD, CVD, or the like. The conductive material can be copper, a copper alloy, silver, gold, tungsten, aluminum, or the like formed by ALD, CVD, PVD, plating, or the like. A planarization process, such as CMP, may be performed to remove any excess material from the top surface of the sixth dielectric layer 140. Remaining portions of the liner and the conductive material form the vias 142 and metallization 144.

FIG. 24A further illustrates locations of representative various overlay cross sections that will be subsequently discussed. The cross sections shown in FIG. 24A are not necessarily representative of the various layouts discussed below, but are representative of features of the various layouts to illustrate, e.g., aspects of the various levels of the layouts. FIG. 24A illustrates an active area level AA, a gate electrode level GL, a top plate level TP, a first via level VL1, a first metallization level M1, a second via level VL2, and a second metallization level M2. FIG. 24B illustrates an overlaid layout of the active area level AA and the gate electrode level GL of FIG. 24A. FIG. 24C illustrates an overlaid layout of the top plate level TP of FIG. 24A. FIGS. 24B and 24C illustrate a cross section A-A that is shown in FIG. 24A.

One having ordinary skill in the art will readily understand that additional dielectric layers, such as IMDs, can be formed, which dielectric layer can include additional metallizations and vias. Further, one having ordinary skill in the art will readily understand that the layers and/or levels discussed herein can be modified. For example, contacts 126, 128, and 130 can be modified and/or obviated if the vias 136 of the first via level VL1 extend further from the first metallization level M1, such as when a via 136 physically and electrically couples a metal-semiconductor compound region 122.

Figure 25A:
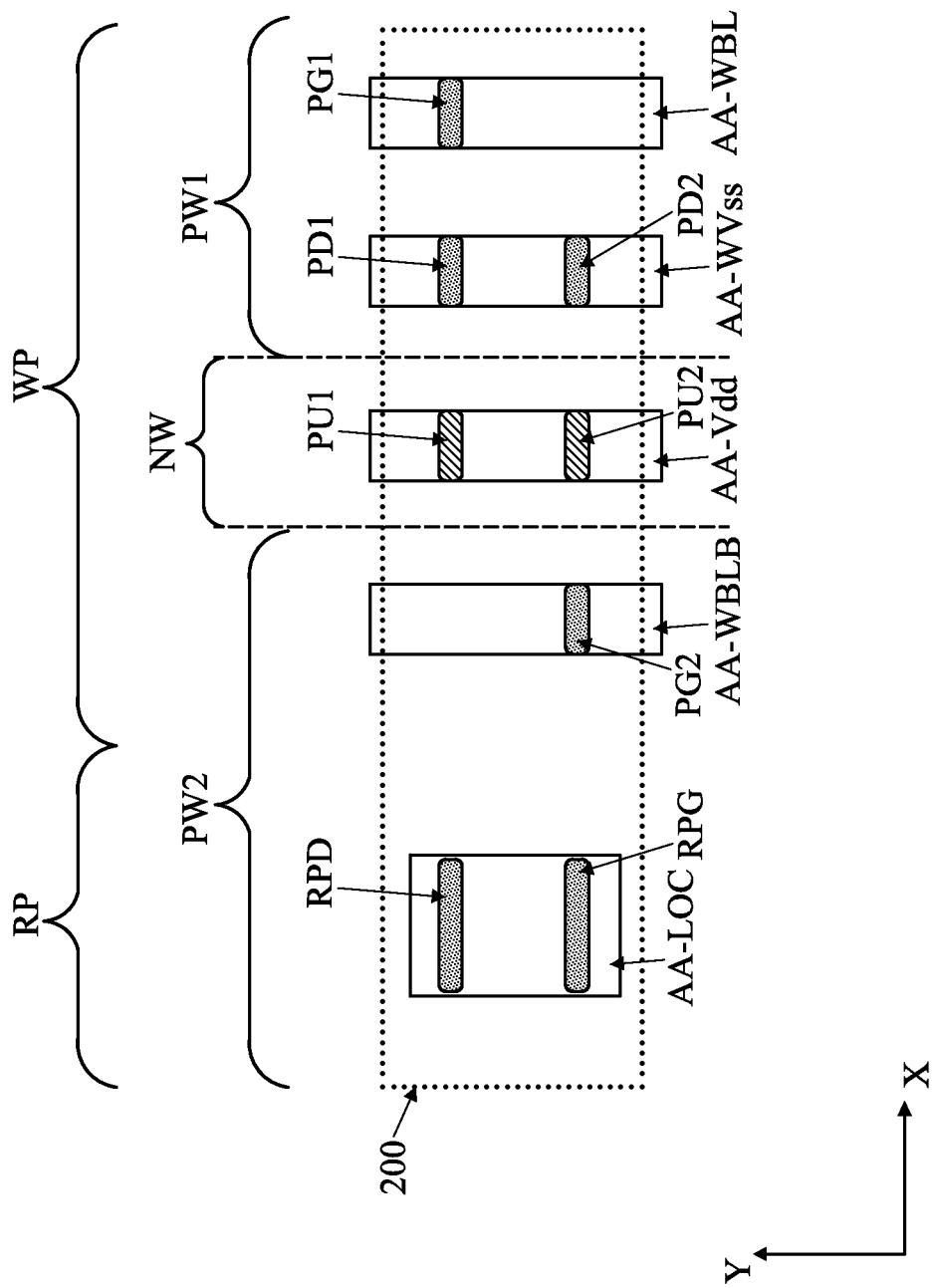
FIGS. 25A, 26, and 27 are respective levels of a first Two-Port SRAM bit cell in accordance with some embodiments.
Figure 26:
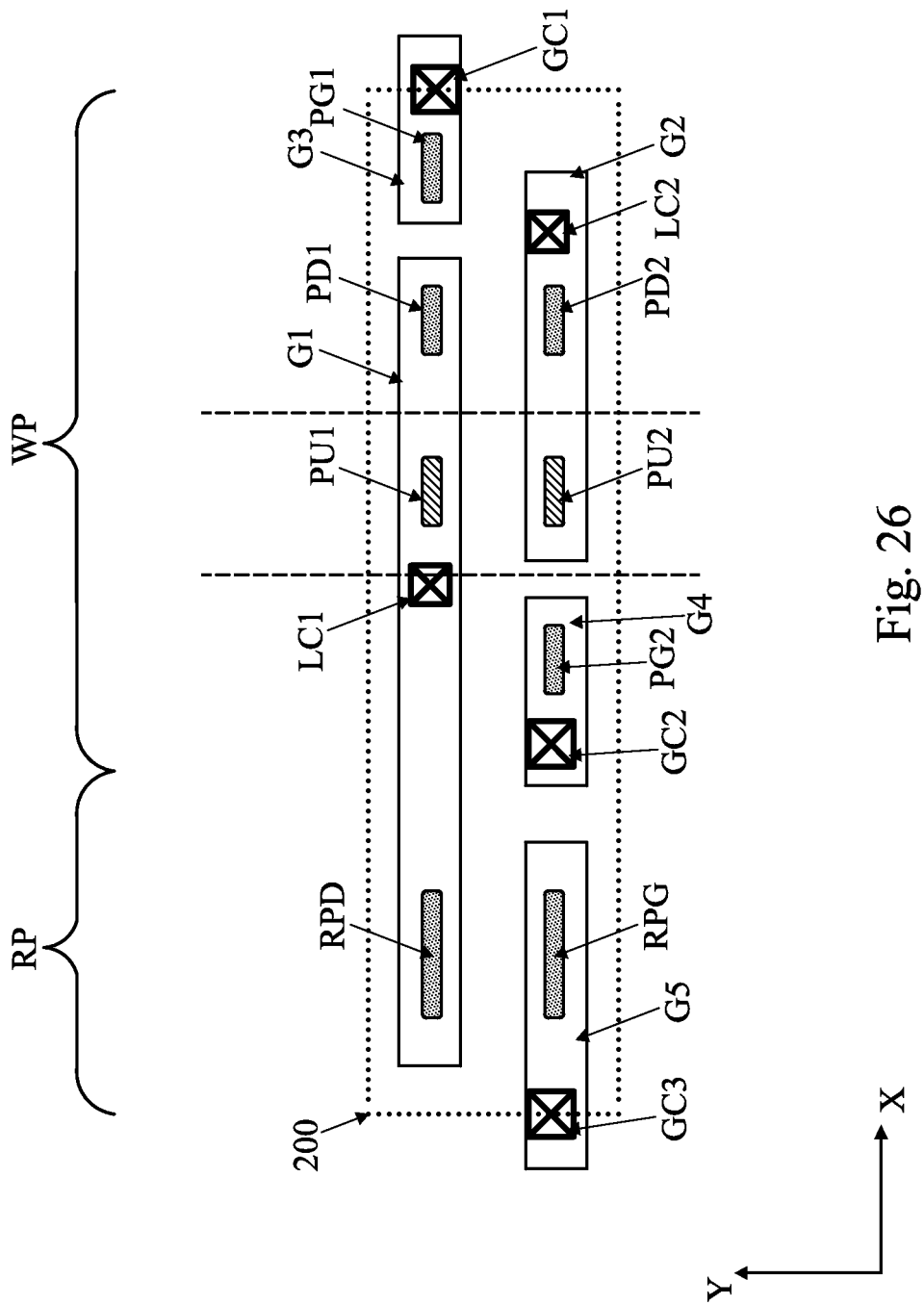
Figure 27:
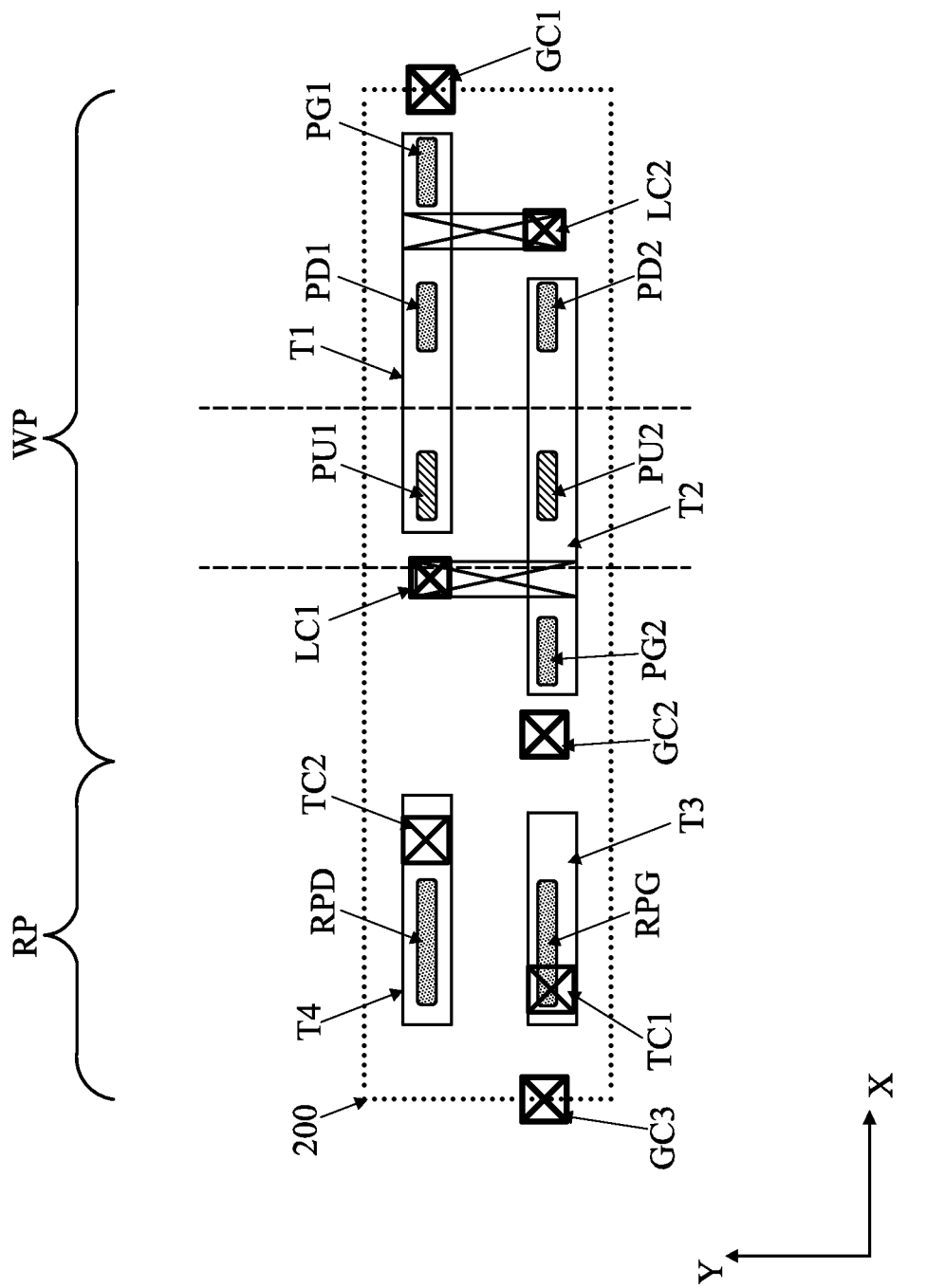

FIGS. 25A, 26, and 27 illustrate levels of a first Two-Port SRAM bit cell 200 defined by a boundary (dashed line) in accordance with some embodiments. FIG. 25A illustrates an active area level AA of the first Two-Port SRAM bit cell 200. The respective vertical channel structures (e.g., vertical channel structures 72) of the first pull-down transistor PD1, the second pull-down transistor PD2, and the first pass-gate transistor PG1 are formed in and/or on a first p-well PW1 in the substrate of the cell. The respective vertical channel structures (e.g., vertical channel structures 72) of the second pass-gate transistor PG2, the read-port pull-down transistor RPD, and the read-port pass-gate transistor RPG are formed in and/or on a second p-well PW2 in the substrate of the cell. The respective vertical channel structures (e.g., vertical channel structures 72) of the first pull-up transistor PU1 and the second pull-up transistor PU2 are formed in and/or on an n-well NW in the substrate of the cell. The n-well NW is disposed between the first p-well PW1 and the second p-well PW2.

An active area write bit line conductive feature AA-WBL (e.g., metal-semiconductor compound region 94) extends continuously through a Y-direction of the cell 200. The vertical channel structure of the first pass-gate transistor PG1 is formed on and/or in the active area of the substrate on which the conductive feature AA-WBL is formed. An active area write second power voltage conductive feature AA-WVss (e.g., metal-semiconductor compound region 94) extends continuously through a Y-direction of the cell 200. The respective vertical channel structures of the first pull-down transistor PD1 and the second pull-down transistor PD2 are formed on and/or in the active area of the substrate on which the conductive feature AA-WVss is formed. An active area first power voltage conductive feature AA-Vdd (e.g., metal-semiconductor compound region 96) extends continuously through a Y-direction of the cell 200. The respective vertical channel structures of the first pull-up transistor PU1 and the second pull-up transistor PU2 are formed on and/or in the active area of the substrate on which the conductive feature AA-Vdd is formed. An active area complementary write bit line conductive feature AA-WBLB (e.g., metal-semiconductor compound region 94) extends continuously through a Y-direction of the cell 200. The vertical channel structure of the second pass-gate transistor PG2 is formed on and/or in the active area of the substrate on which the conductive feature AA-WBLB is formed. A local active area conductive feature AA-LOC (e.g., metal-semiconductor compound region 94) is local to and contained within the cell 200. The local active area conductive feature AA-LOC may be referred to as an island. The vertical channel structures of the read-port pass-gate transistor RPG and the read-port pull-down transistor RPD are formed on and/or in the active area of the substrate on which the conductive feature AA-LOC is formed.

The conductive features AA-WBL and AA-WVss are formed on the first p-well PW1 area of the substrate. The conductive features AA-WBLB and AA-LOC are formed on the second p-well PW2 area of the substrate. The conductive feature AA-Vdd is formed on the n-well NW area of the substrate.

The vertical channel structures of the first pass-gate transistor PG1, the first pull-down transistor PD1, the first pull-up transistor PU1, and the read-port pull-down transistor RPD are aligned in an X-direction. Similarly, the vertical channel structures of the second pull-down transistor PD2, the second pull-up transistor PU2, the second pass-gate transistor PG2, and the read-port pass-gate transistor RPG are aligned in an X-direction.

The channel width, e.g., in an X-direction of FIG. 25A, of the read-port pull-down transistor RPD is larger than the respective channel widths of the first pull-down transistor PD1 and the second pull-down transistor PD2, such as by at least 40%. The channel width, e.g., in an X-direction of FIG. 25A, of the read-port pass-gate transistor RPG is larger than the respective channel widths of the first pass-gate transistor PG1 and the second pass-gate transistor PG2, such as by at least 40%. The channel widths, e.g., in an X-direction of FIG. 25A, of the first pull-down transistor PD1 and the second pull-down transistor PD2 are larger than the channel widths of the first pull-up transistor PU1, the second pull-up transistor PU2, the first pass-gate transistor PG1, and the second pass-gate transistor PG2.

Figure 25B:
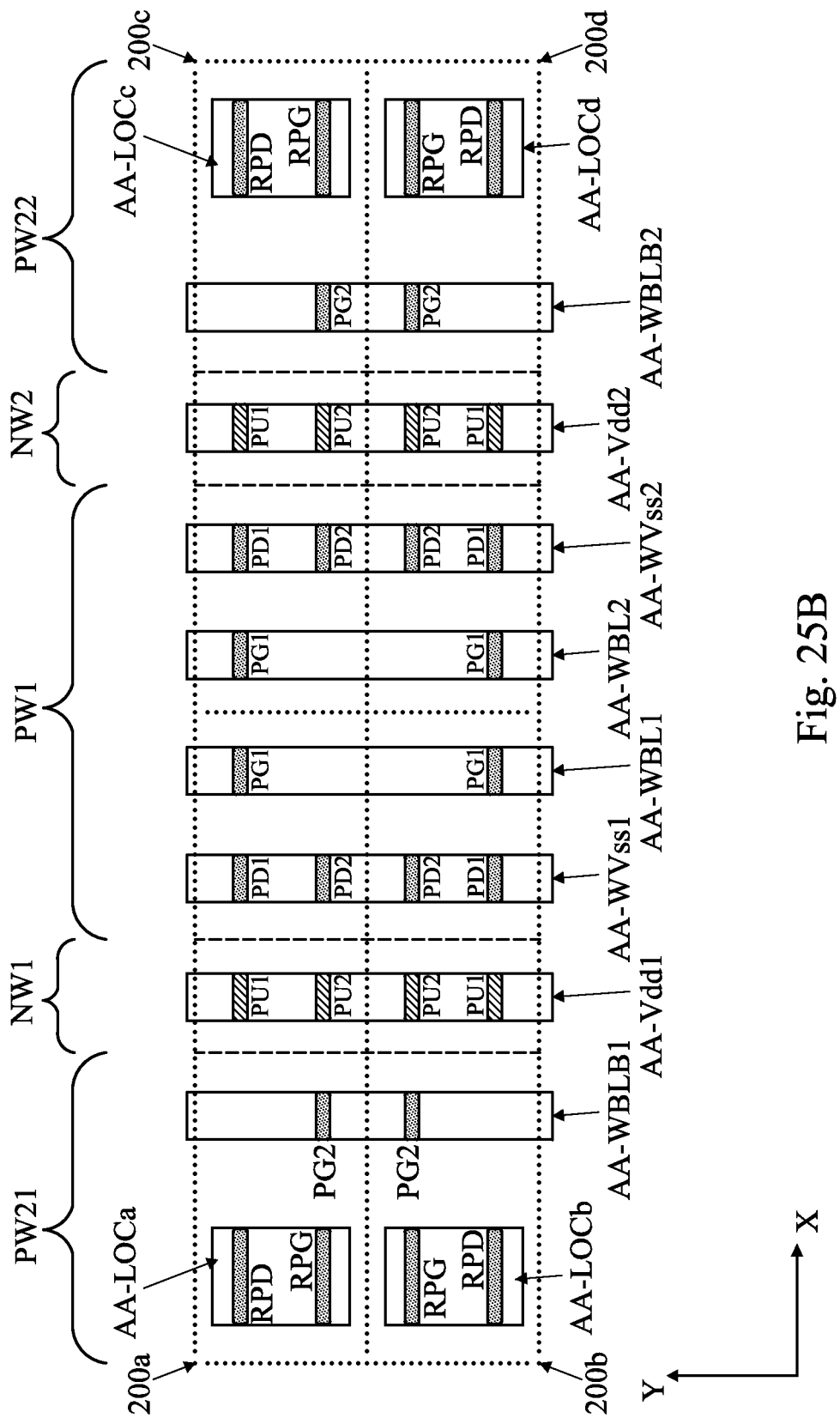
FIG. 25B is a 2×2 array of cells in accordance with some embodiments.

FIG. 25B illustrates a 2×2 array of cells 200 in accordance with some embodiments. Larger arrays are contemplated, and the 2×2 array is depicted to clearly and simply illustrate various aspects of some embodiments. In the array, each cell 200 has an adjacent cell 200 that is mirrored across the X or Y-direction boundary where the cells 200 adjoin. For example, cell 200b is a mirrored version of cell 200a along an X-direction boundary between the cells 200a and 200b. Similarly, cell 200c is a mirrored version of cell 200a along a Y-direction boundary between the cells 200a and 200c.

Further, various p-wells and n-wells may extend across multiple cells 200. FIG. 25B illustrates a first n-well NW1 that extends along a Y-direction across the cells 200a and 200b, and illustrates a second n-well NW2 that extends along a Y-direction across the cells 200c and 200d. A first p-well PW1 extends along a Y-direction and across Y-direction boundaries of adjacent cells 200 between the first n-well NW1 and the second n-well NW2. As illustrated, the first p-well PW1 crosses the Y-direction boundary between cells 200a and 200c, crosses the Y-direction boundary between cells 200b and 200d, and extends in a Y-direction. A first second p-well PW21 is on an opposite side of the first n-well NW1 from the first p-well PW1. A second second p-well PW22 is on an opposite side of the second n-well NW2 from the first p-well PW1. The first second p-well PW21 and the second p-well PW22 can extend across boundaries of cells 200 similar to the first p-well PW1, although additional cells are not depicted to illustrate such features.

Active area conductive features (e.g., metal-semiconductor compound regions 94 and 96) extend continuously in respective Y-directions across multiple cells. As illustrated, first conductive features AA-WBLB1, AA-Vdd1, AA-WVss1, and AA-WBL1 extend in respective Y-directions across cells 200a and 200b. Similarly, second conductive features AA-WBLB2, AA-Vdd2, AA-WVss2, and AA-WBL2 extend in respective Y-directions across cells 200c and 200d. In this manner, the various electrical signals can be electrically coupled to the respective transistors in the cell 200 without a contact being provided in the cell 200 to electrically couple the respective transistors to the electrical signals. For example, a contact can be provided to conductive feature AA-WVss1 to, e.g., provide a ground or low voltage across cells 200a and 200b at a location outside of the cells 200a and 200b (such as by providing the contact in a strap cell as discussed subsequently) and without a contact being formed to the conductive feature AA-Vss1 in either cell 200a or cell 200b. Each cell 200a, 200b, 200c, and 200d further includes a local active area conductive feature AA-LOCa, AA-LOCb, AA-LOCc, and AA-LOCd, respectively, that does not extend beyond the boundary of the respective cell 200a, 200b, 200c, and 200d.

FIG. 26 illustrates a gate electrode level GL of the first Two-Port SRAM bit cell 200. A first gate electrode G1 (e.g., gate electrode layer 104) extends in an X-direction and is around the vertical channel structures of the first pull-down transistor PD1, the first pull-up transistor PU1, and the read-port pull-down transistor RPD. A second gate electrode G2 (e.g., gate electrode layer 104) extends in an X-direction and is around the vertical channel structures of the second pull-down transistor PD2 and the second pull-up transistor PU2. A third gate electrode G3 (e.g., gate electrode layer 104) extends in an X-direction and is around the vertical channel structure of the first pass-gate transistor PG1. A fourth gate electrode G4 (e.g., gate electrode layer 104) extends in an X-direction and is around the vertical channel structure of the second pass-gate transistor PG2. A fifth gate electrode G5 (e.g., gate electrode layer 104) extends in an X-direction and is around the vertical channel structure of the read-port pass-gate transistor RPG. Each of the third gate electrode G3 and the fifth gate electrode G5 can extend across a respective Y-direction boundary to an adjacent cell and be around the respective vertical channel structures of the first pass-gate transistor PG1 and the read-port pass-gate transistor RPG of the respective adjacent cell.

Gate contacts GC1, GC2, and GC3 and local connection contacts LC1 and LC2 are also illustrated in FIG. 26. Local connection contact LC1 (e.g., contact 132) is formed to and physically and electrically couples the first gate electrode G1. Local connection contact LC2 (e.g., contact 132) is formed to and physically and electrically couples the second gate electrode G2. Gate contact GC1 (e.g., contact 130) is formed to and physically and electrically couples the third gate electrode G3. Gate contact GC2 (e.g., contact 130) is formed to and physically and electrically couples the fourth gate electrode G4. Gate contact GC3 (e.g., contact 130) is formed to and physically and electrically couples the fifth gate electrode G5. The gate contacts GC1 and GC3 are located at respective Y-direction boundaries of the cell 200, and gate contact GC2 is located within the cell 200.

FIG. 27 illustrates a top plate level TP of the first Two-Port SRAM bit cell 200. A first top plate T1 (e.g., metal-semiconductor compound regions 122) extends in an X-direction and is on and physically and electrically coupled to the vertical channel structures (e.g., source/drain regions 110 or 114) of the first pull-up transistor PU1, the first pull-down transistor PD1, and the first pass-gate transistor PG1. A second top plate T2 (e.g., metal-semiconductor compound regions 122) extends in an X-direction and is on and physically and electrically coupled to the vertical channel structures (e.g., source/drain regions 110 or 114) of the second pull-up transistor PU2, the second pull-down transistor PD2, and the second pass-gate transistor PG2. A third top plate T3 (e.g., metal-semiconductor compound regions 122) is on and physically and electrically coupled to the vertical channel structure (e.g., source/drain region 110) of the read-port pass-gate transistor RPG. A fourth top plate T4 (e.g., metal-semiconductor compound regions 122) is on and physically and electrically coupled to the vertical channel structure (e.g., source/drain region 110) of the read-port pull-down transistor RPD.

The first local connection contact LC1 is physically and electrically coupled to the second top plate T2. The second local connection contact LC2 is physically and electrically coupled to the first top plate T1. A first top plate contact TC1 (e.g., contact 128) is physically and electrically coupled to the third top plate T3. A second top plate contact TC2 (e.g., contact 128) is physically and electrically coupled to the fourth top plate T4. The top plate contacts TC1 and TC2 are located within the area of the cell 200. Gate contacts GC1, GC2, and GC3 are illustrated extending through the top plate level TP.

Figure 28A:
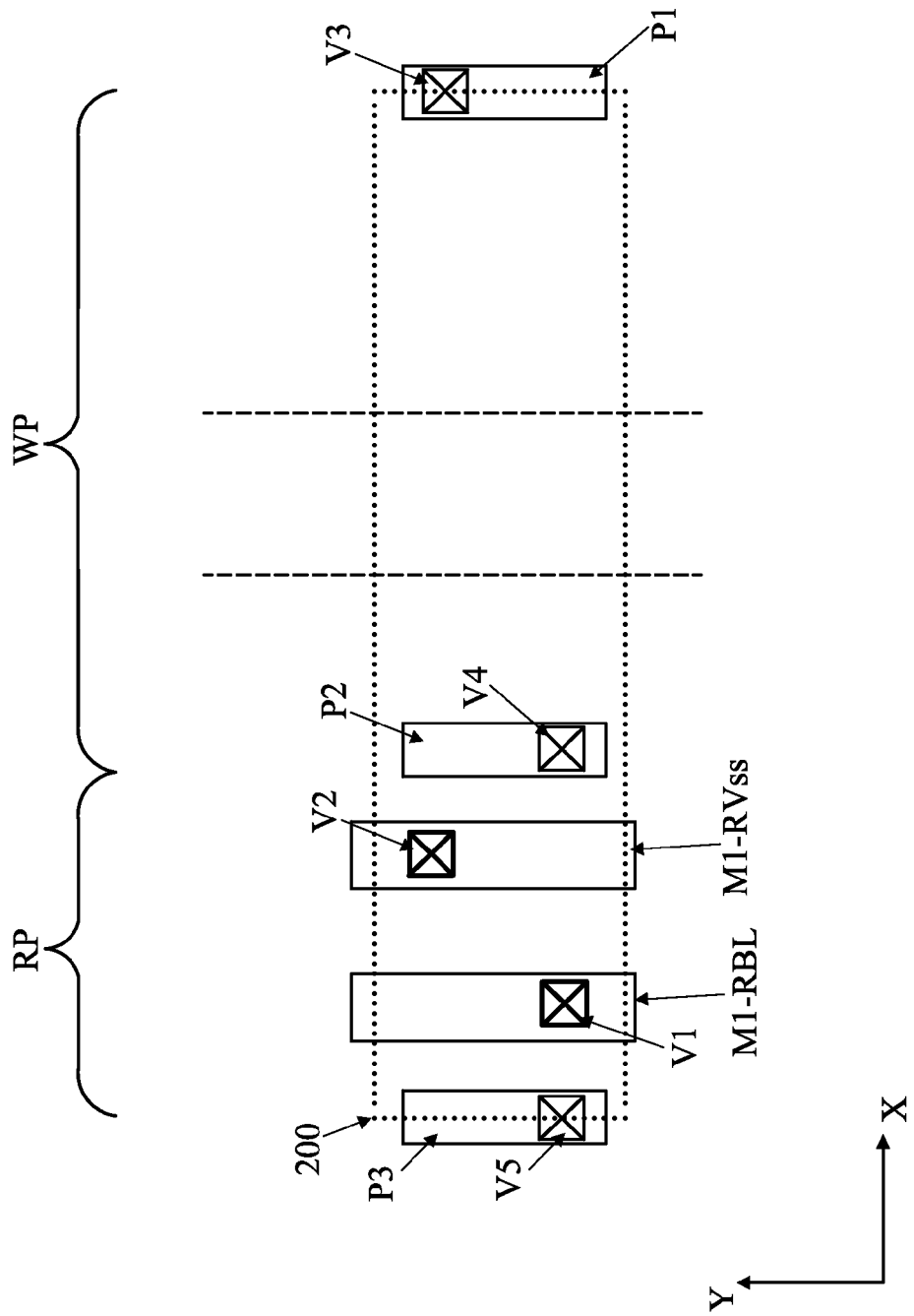
FIGS. 28A, 28B, and 29 are examples of first via levels VL1, first metallization levels M1, a second via level VL2, and a second metallization level M2 of the first Two-Port SRAM bit cell in accordance with some embodiments.
Figure 28B:
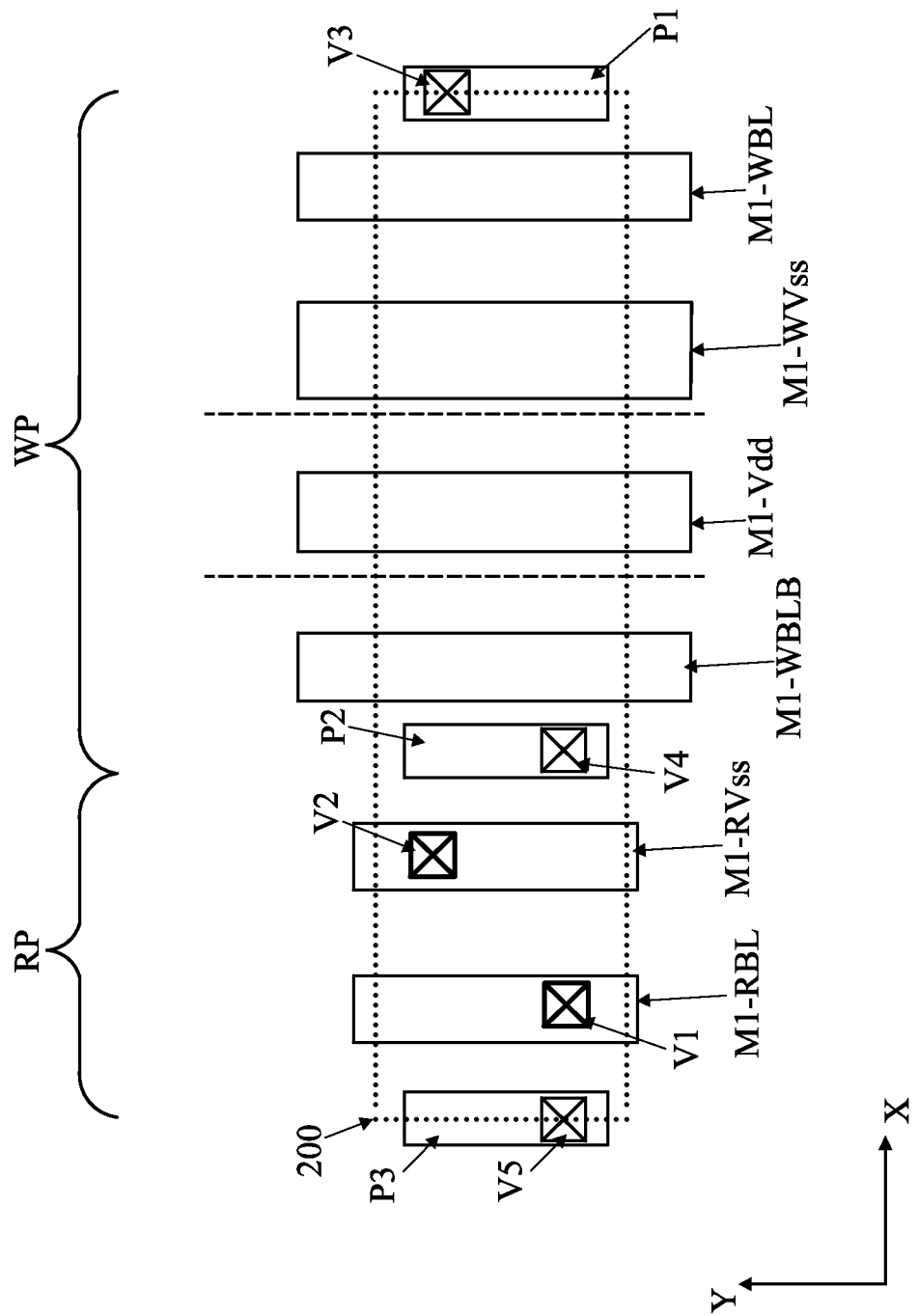
Figure 29:
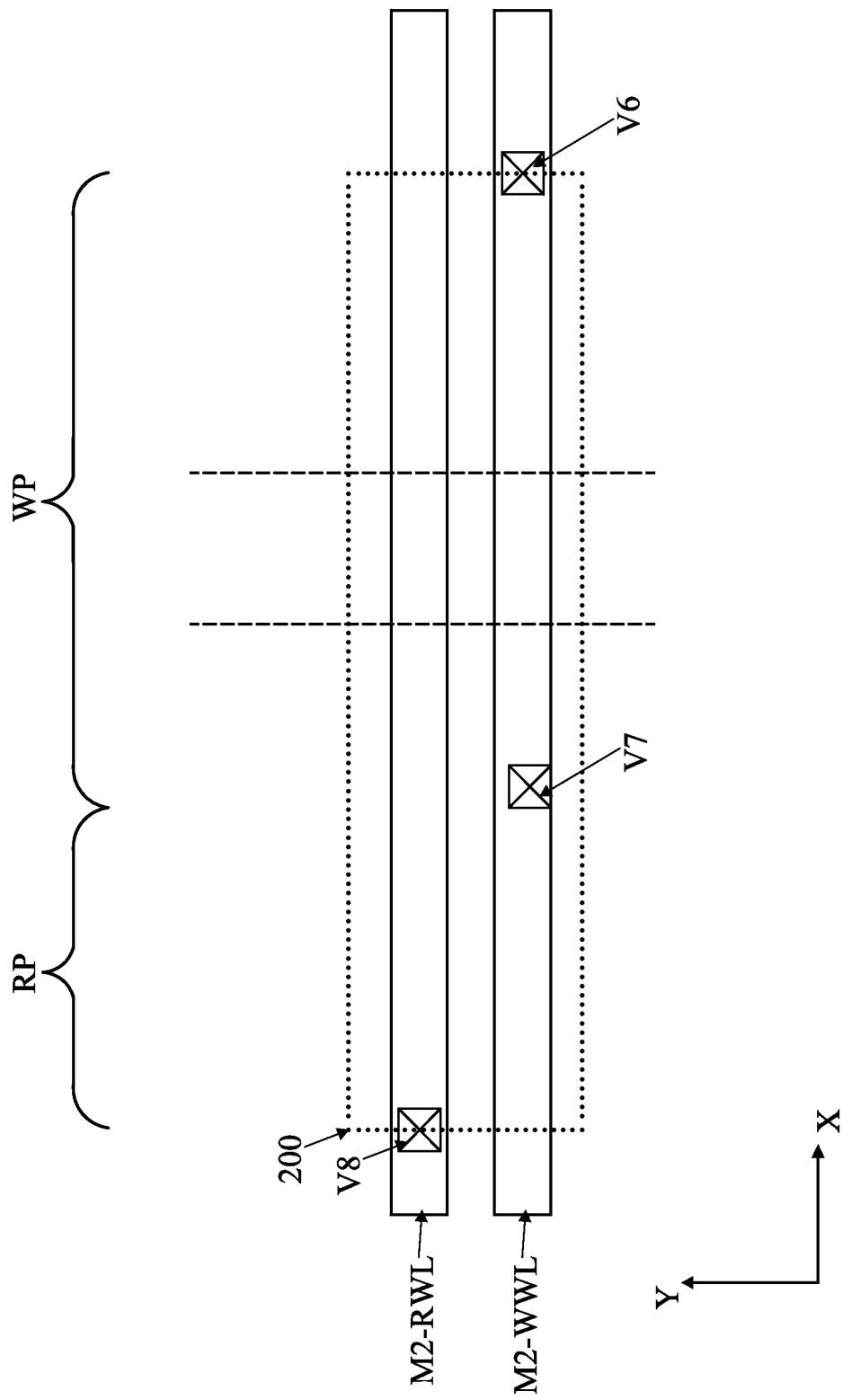

FIGS. 28A, 28B, and 29 illustrate example first via levels VL1, first metallization levels M1, a second via level VL2, and a second metallization level M2 of the first Two-Port SRAM bit cell 200 defined by a boundary (dashed line) in accordance with some embodiments. FIG. 28A illustrates a first example of the first via level VL1 and the first metallization level M1. The first metallization level M1 includes metallization traces M1-RBL and M1-RVss (e.g., metallization 138) and metallization landing pads P1, P2, and P3 (e.g., metallization 138). The metallization traces M1-RBL and M1-RVss extend along a Y-direction and generally correspond in location to the conductive features AA-RBL and AA-RVss. A first via V1 (e.g., via 136) extends from the metallization trace M1-RBL. A second via V2 (e.g., via 136) extends from the metallization traces M1-RVss. The vias V1 and V2 are located within the area of the cell 200. A third via V3 (e.g., via 136) extends from the first landing pad P1. A fourth via V4 (e.g., via 136) extends from the second landing pad P2. A fifth via V5 (e.g., via 136) extends from the third landing pad P3. The first via V1 physically and electrically couples the first top plate contact TC1 (see FIG. 27). The second via V2 physically and electrically couples the second top plate contact TC2 (see FIG. 27). The third via V3 physically and electrically couples the first gate contact GC1 (see FIG. 27). The fourth via V4 physically and electrically couples the second gate contact GC2 (see FIG. 27). The fifth via V5 physically and electrically couples the third gate contact GC3 (see FIG. 27).

FIG. 28B illustrates a second example of the first via level VL1 and the first metallization level M1. The first metallization level M1 of FIG. 28B includes features discussed above with respect to FIG. 28A, and discussion of those features is omitted here for brevity. The first metallization level M1 of FIG. 28B further includes metallization traces M1-WBLB, M1-Vdd, M1-WVss, and M1-WBL. No vias extend from the metallization traces M1-WBLB, M1-Vdd, M1-WVss, and M1-WBL within the cell 200. Vias may extend from the metallization traces M1-WBLB, M1-Vdd, M1-WVss, and M1-WBL at locations outside of the cell 200, which may electrically couple the metallization traces M1-WBLB, M1-Vdd, M1-WVss, and M1-WBL to the conductive features AA-WBLB, AA-Vdd, AA-WVss, and AA-WBL, respectively. As illustrated in FIG. 28A, no metallization traces M1-WBLB, M1-Vdd, M1-WVss, and M1-WBL extend across the cell 200, whereas in FIG. 28B, metallization traces M1-WBLB, M1-Vdd, M1-WVss, and M1-WBL extend across the cell 200.

FIG. 29 illustrates the second via level VL2 and the second metallization level M2. The second metallization level M2 includes metallization traces M2-RWL and M2-WWL (e.g., metallization 144). The metallization traces M2-RWL and M2-WWL extend along an X-direction. A sixth via V6 (e.g., via 142) and a seventh via V7 (e.g., via 142) each extend from the metallization trace M2-WWL. An eighth via V8 (e.g., via 142) extends from the metallization trace M2-RWL. The sixth via V6 physically and electrically couples the first landing pad P1 (see FIG. 28). The seventh via V7 physically and electrically couples the second landing pad P2 (see FIG. 28). The eighth via V8 physically and electrically couples the third landing pad P3 (see FIG. 28).

Figure 30:
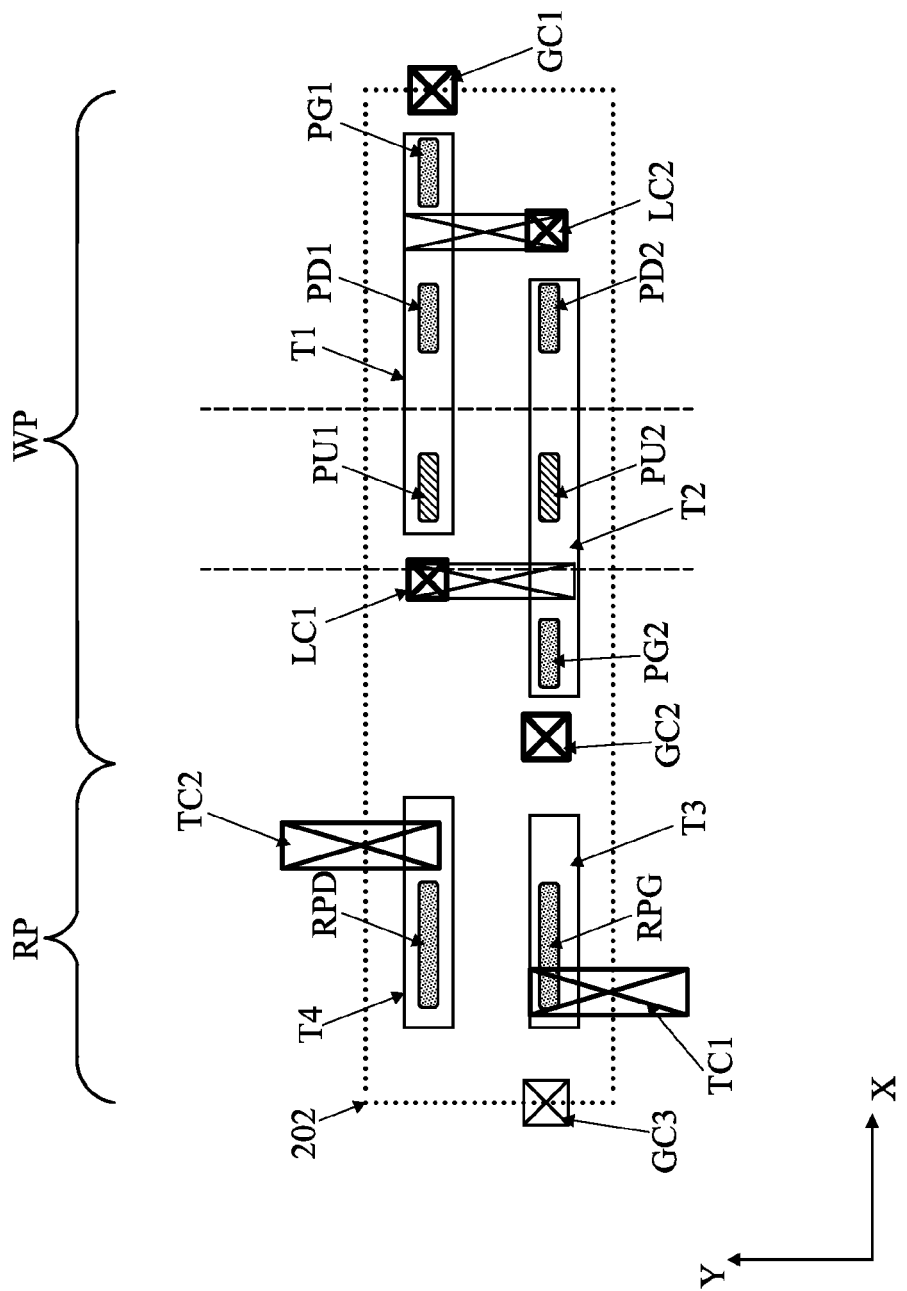
FIG. 30 illustrates a top plate level of a second Two-Port SRAM bit cell in accordance with some embodiments.

FIG. 30 illustrates a top plate level TP of a second Two-Port SRAM bit cell 202 defined by a boundary (dashed line) in accordance with some embodiments. The cell 202 has the same active area level AA as illustrated in and discussed with respect to FIG. 25A, and the same gate electrode level GL as illustrated in and discussed with respect to FIG. 26. FIG. 30 illustrates a top plate level TP of the second Two-Port SRAM bit cell 202 similar to the top plate level TP of FIG. 27. For brevity of discussion, features common to both FIGS. 27 and 30 will be omitted. FIG. 30 illustrates a modification to the top plate contacts TC1 and TC2. Each of the top plate contacts TC1 and TC2 are elongated in respective Y-directions. Each of the top plate contacts TC1 and TC2 extend over respective X-direction boundaries and may further be physically and electrically coupled to a third top plate T3 and a fourth top plate T4 of an adjacent cell, respectively.

Figure 31A:
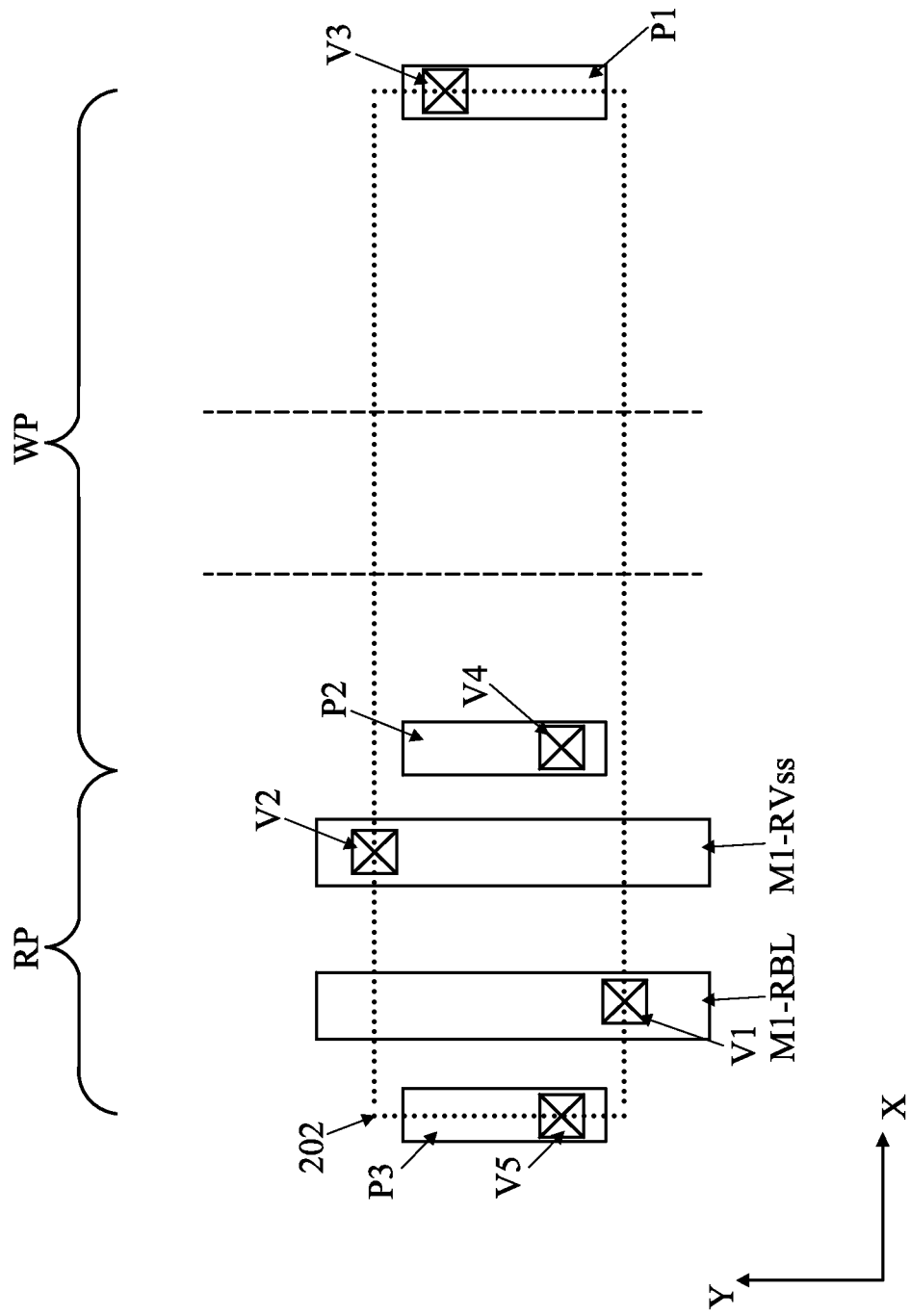
FIGS. 31A and 31B are examples of first via levels VL1 and first metallization levels M1 of the second Two-Port SRAM bit cell in accordance with some embodiments.
Figure 31B:
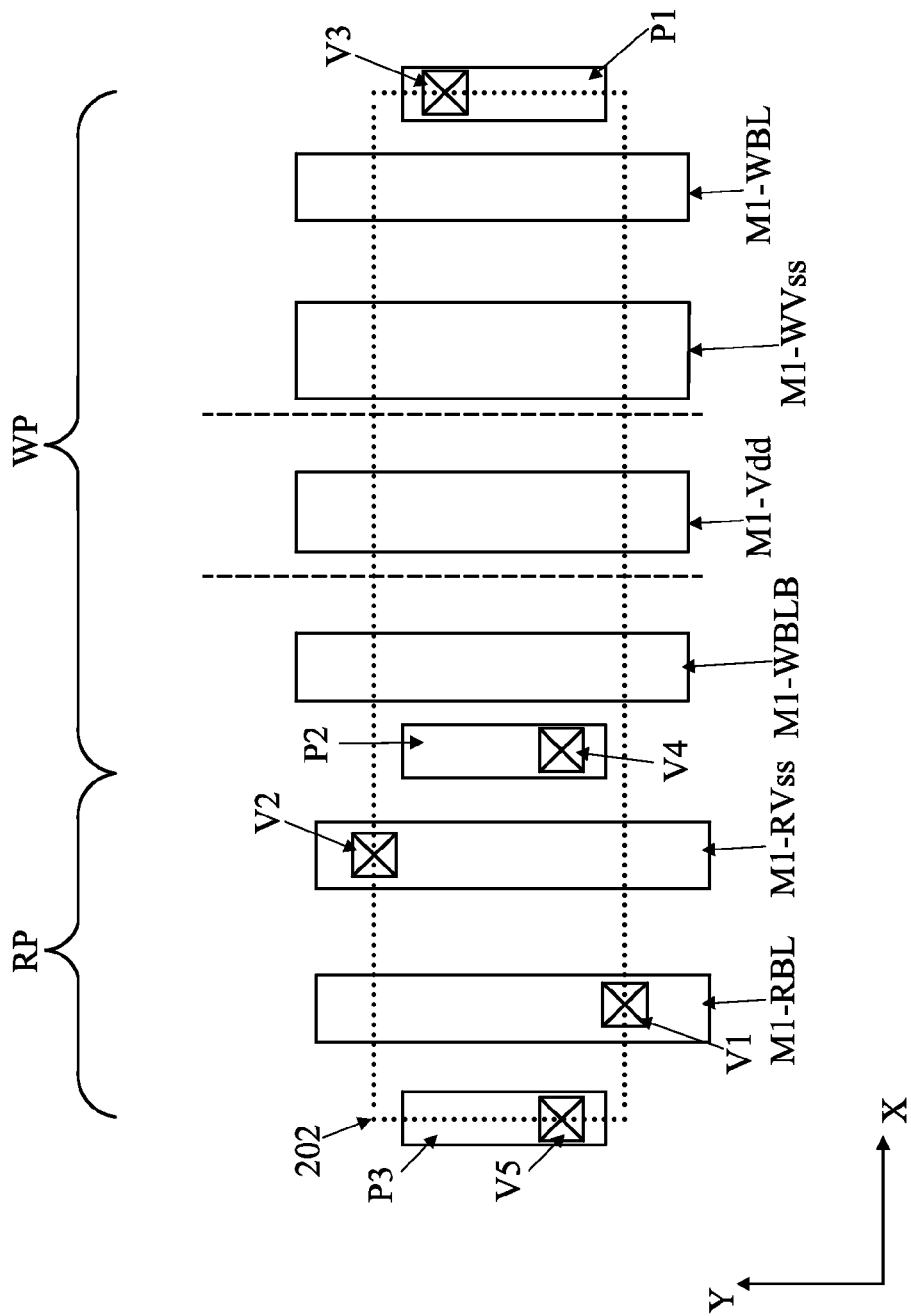

FIGS. 31A and 31B illustrate examples of first via levels VL1 and first metallization levels M1 of the second Two-Port SRAM bit cell 202 defined by a boundary (dashed line) in accordance with some embodiments. FIGS. 31A and 31B illustrate example first via levels VL1 and first metallization levels M1 similar to the first via levels VL1 and first metallization levels M1 of FIGS. 28A and 28B, respectively. For brevity of discussion, features common to both FIGS. 28A and 31A and features common to both FIGS. 28B and 31B will be omitted. As with FIGS. 28A and 28B, the first via V1 extends from the metallization trace M1-RBL, and the second via V2 extends from the metallization traces M1-RVss. The vias V1 and V2 are located at respective X-direction boundaries of the cell 200. The first via V1 physically and electrically couples the first top plate contact TC1 (see FIG. 30). The second via V2 physically and electrically couples the second top plate contact TC2 (see FIG. 30). The second metallization level M2 and the second metallization level VL2 of FIG. 29 can be used with the second Two-Port SRAM bit cell 202.

Figure 32:
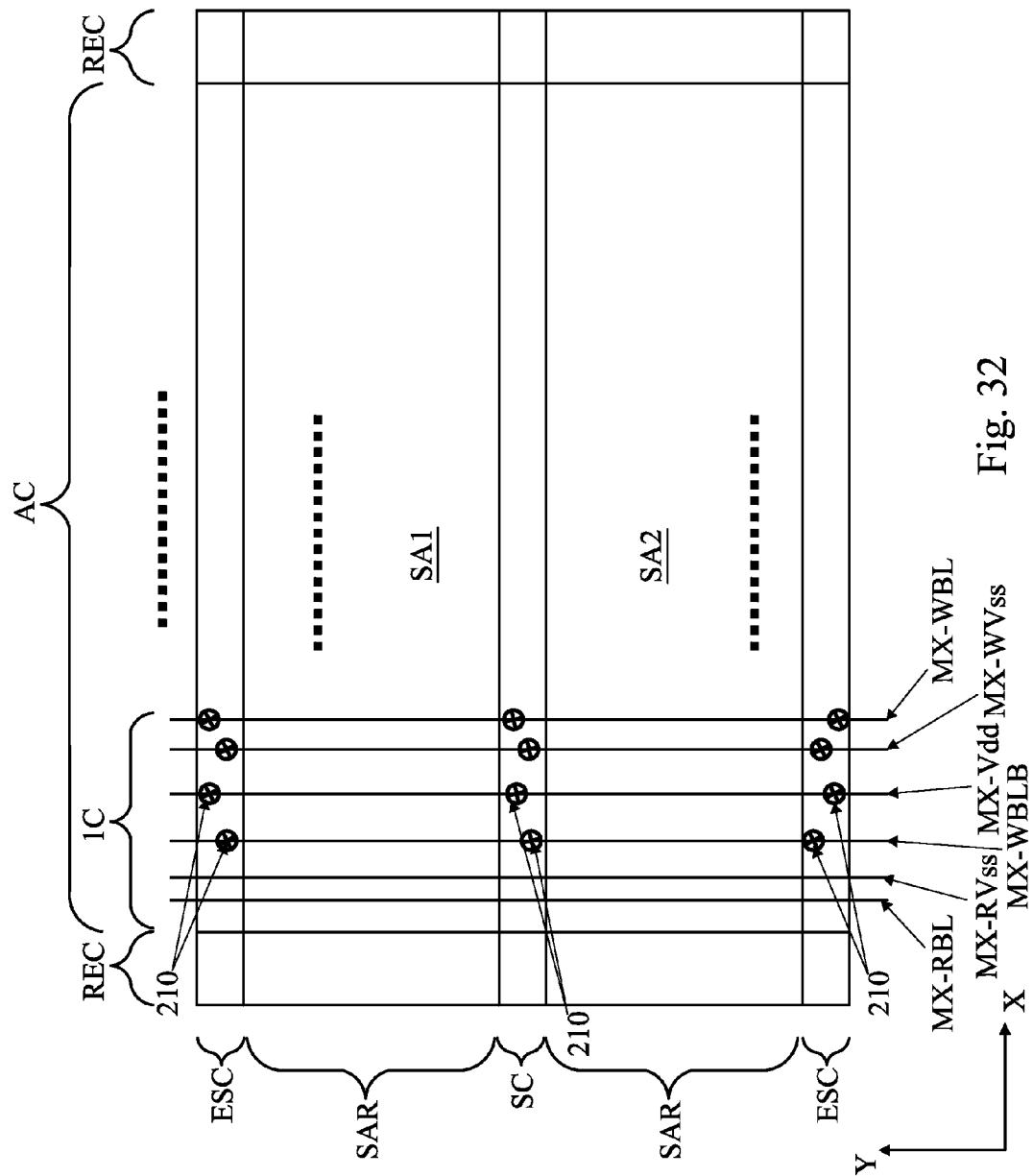
FIG. 32 is an array of Two-Port SRAM bit cells in accordance with some embodiments.

FIG. 32 illustrates an array of Two-Port SRAM bit cells in accordance with some embodiments. The array comprises a plurality of sub-arrays. A first sub-array SA1 and a second sub-array SA2 are illustrated in FIG. 32, and the array can include more or less sub-arrays. Each sub-array can comprise the cells 200 or 202 in the repeating pattern as discussed with respect to FIG. 25B. For convenience, each row of the array extends along an X-direction, and each column extends along a Y-direction. The array comprises array columns AC. Each sub-array comprises sub-array rows SAR. The array comprises a row edge cell REC on each end of each row. The array comprises an edge strap cell ESC on each end of each column. The array comprises a strap cell SC between a column of a first neighboring sub-array, e.g., the first sub-array SA1, and a corresponding column of a second neighboring sub-array, e.g., the second sub-array SA2.

The strap cells SC and ESC may comprise active areas, e.g., with metal-semiconductor compound regions 94 and/or 96, which active areas extend throughout the cells of the respective column. For example, a strap cell SC can include an active area write bit line AA-WBL, and this active area write bit line AA-WBL can extend through each cell within the column. This active area write bit line AA-WBL can include a metal-semiconductor compound region, e.g., metal-semiconductor compound region 94. Other active areas can be similarly configured. The active areas in the strap cells SC and ESC can include dummy vertical channel structures, e.g., to provide improved uniformity, and/or can omit vertical channel structures.

The array of FIG. 32 further includes metallization traces MX-RLB, MX-RVss, MX-WBLB, MX-Vdd, MX-WVss, and MX-WBL extending along a Y-direction for a column. These metallization traces MX-RLB, MX-RVss, MX-WBLB, MX-Vdd, MX-WVss, and MX-WBL can be in a first metallization M1 as discussed with respect to FIGS. 28B and 31B, another metallization, or a combination of various metallizations. Similar metallization traces can be in a similar pattern, such as the same or in a mirrored arrangement, for the remaining columns of the array columns AC.

A connection 210 is made in a strap cell SC and/or ESC between a metallization trace MX-WBLB, MX-Vdd, MX-WVss, and MX-WBL and an active area conductive feature AA-WBLB, AA-Vdd, AA-WVss, and AA-WBL, respectively. For example, if the metallization traces are in a first metallization M1, the connection 210 can comprise a via (e.g., via 136) and an active area contact (e.g., contact 126). Further for example, if the metallization traces are in a second metallization M2, the connection 210 can comprise a second level via (e.g., via 142), a landing pad in a first metallization (e.g., in metallization 138), a first level via (e.g., via 136), and an active area contact (e.g., contact 126).

As illustrated, a connection 210 is made in each strap cell SC and ESC in a first column 1C between the complementary write bit line metallization trace MX-WBLB and the complementary write bit line active area conductive feature AA-WBLB. As illustrated, a connection 210 is made in each strap cell SC and ESC in a first column 1C between the first power voltage metallization trace MX-Vdd and the first power voltage active area conductive feature AA-Vdd. As illustrated, a connection 210 is made in each strap cell SC and ESC in a first column 1C between the write second power voltage metallization trace MX-WVss and the write second power voltage active area conductive feature AA-WVss. As illustrated, a connection 210 is made in each strap cell SC and ESC in a first column 1C between the write bit line metallization trace MX-WBL and the write bit line active area conductive feature AA-WBL. By providing these metallization traces with connections at strap cells, a low resistance path may be provided that helps ensure integrity of a signal or power source to cells in the array without providing direct connections within each cell of the array.

In some embodiments, it is contemplated that the metallization traces MX-WBLB, MX-Vdd, MX-WVss, and MX-WBL may be omitted when the number of rows in the array is equal to or less than 64, such as 4 or less and between 4 and 64, and in other embodiments, it is contemplated that the metallization traces MX-WBLB, MX-Vdd, MX-WVss, and MX-WBL may be used when the number of rows in the array is greater than 64. The metallization traces MX-WBLB, MX-Vdd, MX-WVss, and MX-WBL may be used or omitted with any number of cells.

Figure 33:
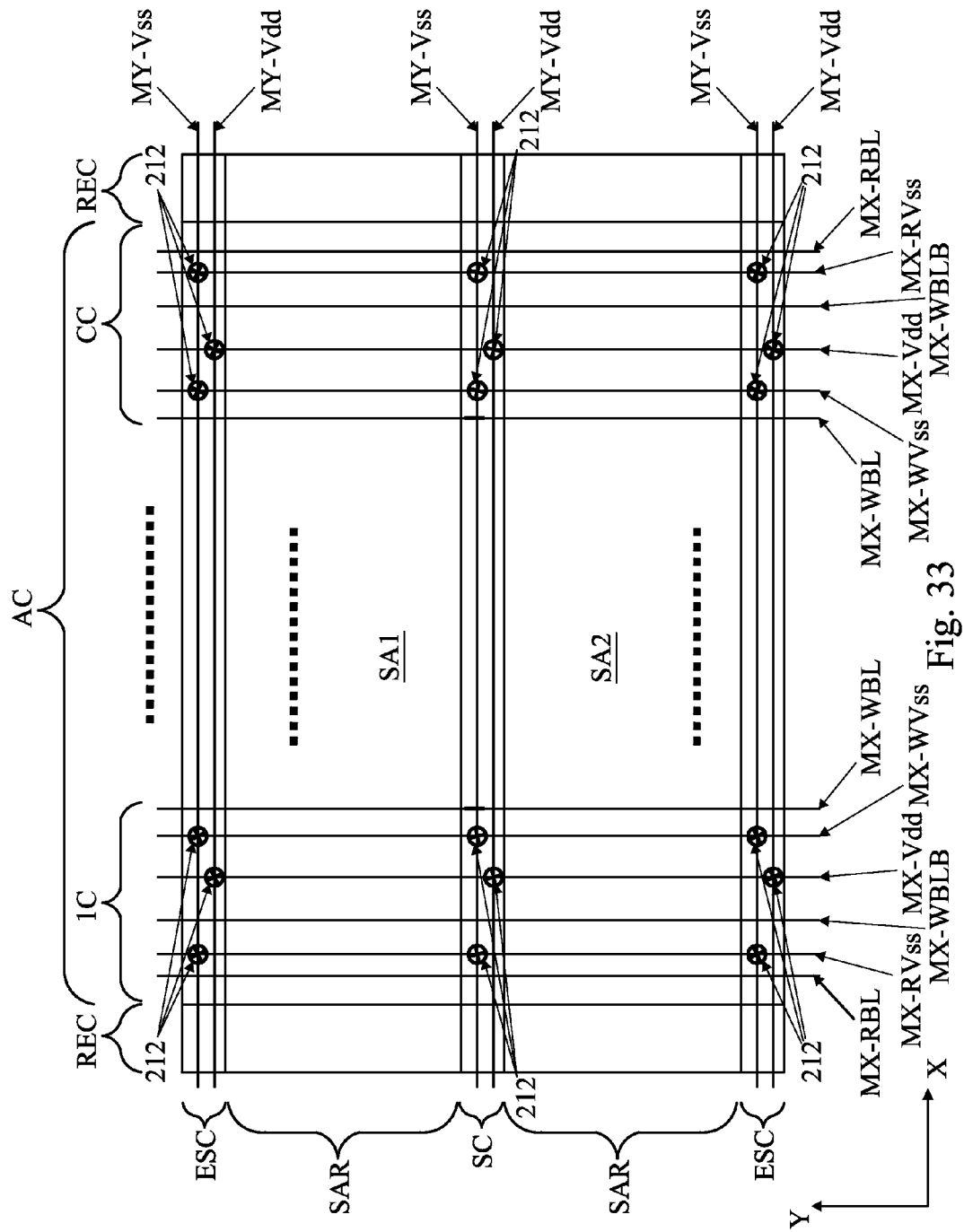
FIG. 33 is an array of Two-Port SRAM bit cells with mesh power voltage metallization traces in accordance with some embodiments.

FIG. 33 illustrates an array of Two-Port SRAM bit cells in accordance with some embodiments. The array of FIG. 33 includes components that correspond to components discussed with respect to FIG. 32, and for brevity, discussion of those components is not repeated here. In FIG. 33, additional metallization traces MX-RLB, MX-RVss, MX-WBLB, MX-Vdd, MX-WVss, and MX-WBL are illustrated for a column CC. Along the rows of strap cells SC and ESC, mesh metallization traces MY-Vss and MY-Vdd extend in a Y-direction. For each mesh metallization trace MY-Vss, a connection 212 is between the mesh metallization trace MY-Vss and a metallization trace MX-RVss and MX-WVss for each column. For each mesh metallization trace MY-Vdd, a connection 212 is between the mesh metallization trace MY-Vdd and a metallization trace MX-Vdd for each column. The mesh metallization traces MY-Vss and MY-Vdd and the metallization traces MX-RVss, MX-WVss, and MX-Vdd are in different metallizations. The connections 212 can comprise a via between the metallizations, or a combination of multiple vias and one or more intervening landing pad in an intervening metallization. By having the mesh metallization traces MY-Vss and MY-Vdd coupled to the metallization traces MX-RVss, MX-WVss, and MX-Vdd in each column as depicted, the potential among the various second power voltage metallization traces MX-RVss and MX-WVss can remain more consistent throughout the array, and similarly, the potential among the various first power voltage metallization traces MX-Vdd can remain more consistent throughout the array.

Some embodiments may achieve advantages. Some embodiments can incorporate the emerging technology of VGAA transistors. Further, some embodiments can implement active area conductive features as conductors for power voltages Vdd and Vss, for write bit lines WBL, and for complementary write bit lines WBLB, which can obviate some connectors within each cell. Some embodiments can further improve a lithography patterning margin, such as by using the VGAA layout, which can further decrease a cell layout size. Further, some embodiments can have a decreased cell area, which may result in increased speed due to lower resistance in shorter routes for signals.

An embodiment is a structure. The structure comprises a two-port static random access memory cell. The cell comprises a first pull-down transistor, a second pull-down transistor, a first pull-up transistor, a second pull-up transistor, a first pass-gate transistor, a second pass-gate transistor, a read-port pull-down transistor, and a read-port pass-gate transistor. The first pull-down transistor comprises a first source/drain region in a first active area in a substrate, a first vertical channel extending above the first active area, and a second source/drain region above the first vertical channel. The second pull-down transistor comprises a third source/drain region in the first active area, a second vertical channel extending above the first active area, and a fourth source/drain region above the second vertical channel. The first source/drain region is electrically coupled to the third source/drain region through the first active area. The first pull-up transistor comprises a fifth source/drain region in a second active area in the substrate, a third vertical channel extending above the second active area, and a sixth source/drain region above the third vertical channel. The second pull-up transistor comprises a seventh source/drain region in the second active area, a fourth vertical channel extending above the second active area, and an eighth source/drain region above the fourth vertical channel. The fifth source/drain region is electrically coupled to the seventh source/drain region through the second active area. The first pass-gate transistor comprises a ninth source/drain region in a third active area in the substrate, a fifth vertical channel extending above the third active area, and a tenth source/drain region above the fifth vertical channel. The second pass-gate transistor comprises an eleventh source/drain region in a fourth active area in the substrate, a sixth vertical channel extending above the fourth active area, and a twelfth source/drain region above the sixth vertical channel. The read-port pull-down transistor comprises a thirteenth source/drain region in a fifth active area in the substrate, a seventh vertical channel extending above the fifth active area, and a fourteenth source/drain region above the seventh vertical channel. The read-port pass-gate transistor comprises a fifteenth source/drain region in the fifth active area, an eighth vertical channel extending above the fifth active area, and a sixteenth source/drain region above the eighth vertical channel. A first gate electrode is around each of the first vertical channel, the third vertical channel, and the seventh vertical channel. A second gate electrode is around each of the second vertical channel and the fourth vertical channel. A third gate electrode is around the fifth vertical channel. A fourth gate electrode is around the sixth vertical channel. A fifth gate electrode is around the eighth vertical channel. A first conductive feature is above and physically coupled to the second source/drain region, the sixth source/drain region, and the tenth source/drain region. The first conductive feature is further electrically coupled to the second gate electrode. A second conductive feature is above and physically coupled to the fourth source/drain region, the eighth source/drain region, and the twelfth source/drain region. The second conductive feature is further electrically coupled to the first gate electrode.

Another embodiment is a structure. The structure comprises a memory array. The array comprises a plurality of two-port static random access memory (2PSRAM) cells arranged in columns and rows. Each of the 2PSRAM cells comprises a first pull-down vertical transistor, a second pull-down vertical transistor, a first pull-up vertical transistor, a second pull-up vertical transistor, a first pass-gate vertical transistor, a second pass-gate vertical transistor, a read-port pull-down vertical transistor, and a read-port pass-gate vertical transistor. Respective first source/drain regions of the first pull-down vertical transistor, the first pull-up vertical transistor, and the first pass-gate vertical transistor are coupled together and to respective gates of the second pull-up vertical transistor and the second pull-down vertical transistor. Respective first source/drain regions of the second pull-down vertical transistor, the second pull-up vertical transistor, and the second pass-gate vertical transistor are coupled together and to respective gates of the first pull-up vertical transistor, the first pull-down vertical transistor, and the read-port pull-down vertical transistor. In each of the columns of 2PSRAM cells in the memory array, a first power node active area is in a substrate and extends along the respective column, a write second power node active area is in the substrate and extends along the respective column, a write bit line node active area is in the substrate and extends along the respective column, and a complementary write bit line node active area is in the substrate and extends along the respective column. Respective second source/drain regions of the first pull-up vertical transistor and the second pull-up vertical transistor of each of the 2PSRAM cells in the respective column are disposed in the first power node active area. Respective second source/drain regions of the first pull-down vertical transistor and the second pull-down transistor of each of the 2PSRAM cells in the respective column are disposed in the write second power node active area. A second source/drain region of the first pass-gate vertical transistor of each of the 2PSRAM cells in the respective column is disposed in the write bit line node active area. A second source/drain region of the second pass-gate vertical transistor of each of the 2PSRAM cells in the respective column is disposed in the complementary write bit line node active area. In each of the 2PSRAM cells in the memory array, a local node active area is in the substrate and is contained within an area of the respective 2PSRAM cell. Respective second source/drain regions of the read-port pull-down vertical transistor and the read-port pass-gate vertical transistor of the respective 2PSRAM cell being disposed in the local node active area.

A further embodiment is a method. A first power node active area, a write second power node active area, a write bit line node active area, a complementary write bit line node active area, and a local node active area are defined in a substrate. A first vertical channel structure, a second vertical channel structure, a third vertical channel structure, a fourth vertical channel structure, a fifth vertical channel structure, a sixth vertical channel structure, a seventh vertical channel structure, and an eighth vertical channel structure are formed in an area. Each of the first, second, third, fourth, fifth, sixth, seventh, and eighth vertical channel structures comprises a first source/drain region disposed in a respective active area, a channel region above the first source/drain region, and a second source/drain region above the channel region. The first source/drain region of the first vertical channel structure is disposed in the first power node active area. The first source/drain region of the second vertical channel structure is disposed in the first power node active area. The first source/drain region of the third vertical channel structure is disposed in the write second power node active area. The first source/drain region of the fourth vertical channel structure is disposed in the write second power node active area. The first source/drain region of the fifth vertical channel structure is disposed in the write bit line node active area. The first source/drain region of the sixth vertical channel structure is disposed in the complementary write bit line node active area. The first source/drain region of the seventh vertical channel structure is disposed in the local node active area. The first source/drain region of the eighth vertical channel structure is disposed in the local node active area. A first gate electrode, a second gate electrode, a third gate electrode, a fourth gate electrode, and a fifth gate electrode are formed over the substrate. The first gate electrode is around the first vertical channel structure, the third vertical channel structure, and the seventh vertical channel structure. The second gate electrode is around the second vertical channel structure and the fourth vertical channel structure. The third gate electrode is around the fifth vertical channel structure. The fourth gate electrode is around the sixth vertical channel structure. The fifth gate electrode is around the eighth vertical channel structure. The respective second source/drain regions of the first vertical channel structure, the third vertical channel structure, and the fifth vertical channel structure are electrically coupled together and to the second gate electrode. The respective second source/drain regions of the second vertical channel structure, the fourth vertical channel structure, and the sixth vertical channel structure are electrically coupled together and to the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a two-port static random access memory cell comprising:
a first pull-down transistor comprising a first source/drain region in a first active area in a substrate, a first vertical channel extending above the first active area, and a second source/drain region above the first vertical channel,
a second pull-down transistor comprising a third source/drain region in the first active area, a second vertical channel extending above the first active area, and a fourth source/drain region above the second vertical channel, the first source/drain region being electrically coupled to the third source/drain region through the first active area,
a first pull-up transistor comprising a fifth source/drain region in a second active area in the substrate, a third vertical channel extending above the second active area, and a sixth source/drain region above the third vertical channel,
a second pull-up transistor comprising a seventh source/drain region in the second active area, a fourth vertical channel extending above the second active area, and an eighth source/drain region above the fourth vertical channel, the fifth source/drain region being electrically coupled to the seventh source/drain region through the second active area,
a first pass-gate transistor comprising a ninth source/drain region in a third active area in the substrate, a fifth vertical channel extending above the third active area, and a tenth source/drain region above the fifth vertical channel,
a second pass-gate transistor comprising an eleventh source/drain region in a fourth active area in the substrate, a sixth vertical channel extending above the fourth active area, and a twelfth source/drain region above the sixth vertical channel,
a read-port pull-down transistor comprising a thirteenth source/drain region in a fifth active area in the substrate, a seventh vertical channel extending above the fifth active area, and a fourteenth source/drain region above the seventh vertical channel,
a read-port pass-gate transistor comprising a fifteenth source/drain region in the fifth active area, an eighth vertical channel extending above the fifth active area, and a sixteenth source/drain region above the eighth vertical channel,
a first gate electrode around each of the first vertical channel, the third vertical channel, and the seventh vertical channel,
a second gate electrode around each of the second vertical channel and the fourth vertical channel, a third gate electrode around the fifth vertical channel,
a fourth gate electrode around the sixth vertical channel,
a fifth gate electrode around the eighth vertical channel,
a first conductive feature above and physically coupled to the second source/drain region, the sixth source/drain region, and the tenth source/drain region, the first conductive feature further being electrically coupled to the second gate electrode, and
a second conductive feature above and physically coupled to the fourth source/drain region, the eighth source/drain region, and the twelfth source/drain region, the second conductive feature further being electrically coupled to the first gate electrode.

2. The structure of claim 1, wherein each of the first active area, the second active area, the third active area, and the fourth active area extends beyond an area of the two-port static random access memory cell.

3. The structure of claim 1, wherein the first active area comprises a third conductive feature, the second active area comprises a fourth conductive feature, the third active area comprises a fifth conductive feature, the fourth active area comprises a sixth conductive feature, and the fifth active area comprises a seventh conductive feature.

4. The structure of claim 1, wherein the two-port static random access memory cell comprises a first p-well in the substrate, an n-well in the substrate, and a second p-well in the substrate, the n-well being disposed between the first p-well and the second p-well, the first active area and the third active area being disposed in the first p-well, the second active area being disposed in the n-well, the fourth active area and the fifth active area being disposed in the second p-well.

5. The structure of claim 1, wherein the first vertical channel, the third vertical channel, the fifth vertical channel, and the seventh vertical channel are aligned along a first direction, the second vertical channel, the fourth vertical channel, the sixth vertical channel, and the eighth vertical channel are aligned along a second direction, each of the first direction and the second direction intersecting each of the first active area, the second active area, the third active area, and the fourth active area.

6. The structure of claim 1, wherein no contact is physically connected in an area of the two-port static random access memory cell to any of the first active area, the second active area, the third active area, the fourth active area, and the fifth active area.

7. The structure of claim 1, wherein the fifth active area is an island contained within an area of the two-port static random access memory cell.

8. The structure of claim 1 further comprising a first metallization level over the two-port static random access memory cell and a second metallization level over the first metallization level,
the first metallization level comprising a first trace and a second trace proximate the fifth active area, the first trace being electrically coupled to the fourteenth source/drain region, the second trace being electrically coupled to the sixteenth source/drain region, and
the second metallization level comprising:
a third trace extending in a direction intersecting the first trace and the second trace, the third trace being electrically coupled to the third gate electrode and the fourth gate electrode, and
an fourth trace extending in a direction intersecting the first trace and the second trace, the fourth trace being electrically coupled to the fifth gate electrode.

9. The structure of claim 8, wherein the first metallization level further comprises:
a fifth trace extending along the first active area,
a sixth trace extending along the second active area,
a seventh trace extending along the third active area, and
an eighth trace extending along the fourth active area, wherein no via extends to or from any of the fifth trace, the sixth trace, the seventh trace, and the eighth trace in an area of the two-port static random access memory cell.

10. A structure comprising:
a memory array comprising:
a plurality of two-port static random access memory (2PSRAM) cells, the 2PSRAM cells being arranged in columns and rows, each of the 2PSRAM cells comprising a first pull-down vertical transistor, a second pull-down vertical transistor, a first pull-up vertical transistor, a second pull-up vertical transistor, a first pass-gate vertical transistor, a second pass-gate vertical transistor, a read-port pull-down vertical transistor, and a read-port pass-gate vertical transistor, respective first source/drain regions of the first pull-down vertical transistor, the first pull-up vertical transistor, and the first pass-gate vertical transistor being coupled together and to respective gates of the second pull-up vertical transistor and the second pull-down vertical transistor, respective first source/drain regions of the second pull-down vertical transistor, the second pull-up vertical transistor, and the second pass-gate vertical transistor being coupled together and to respective gates of the first pull-up vertical transistor, the first pull-down vertical transistor, and the read-port pull-down vertical transistor,
in each of the columns of 2PSRAM cells in the memory array:
a first power node active area in a substrate and extending along the respective column, respective second source/drain regions of the first pull-up vertical transistor and the second pull-up vertical transistor of each of the 2PSRAM cells in the respective column being disposed in the first power node active area,
a write second power node active area in the substrate and extending along the respective column, respective second source/drain regions of the first pull-down vertical transistor and the second pull-down vertical transistor of each of the 2PSRAM cells in the respective column being disposed in the write second power node active area,
a write bit line node active area in the substrate and extending along the respective column, a second source/drain region of the first pass-gate vertical transistor of each of the 2PSRAM cells in the respective column being disposed in the write bit line node active area, and
a complementary write bit line node active area in the substrate and extending along the respective column, a second source/drain region of the second pass-gate vertical transistor of each of the 2PSRAM cells in the respective column being disposed in the complementary write bit line node active area, and
in each of the 2PSRAM cells in the memory array, a local node active area in the substrate and contained within an area of the respective 2PSRAM cell, respective second source/drain regions of the read-port pull-down vertical transistor and the read-port pass-gate vertical transistor of the respective 2PSRAM cell being disposed in the local node active area.

11. The structure of claim 10, wherein the memory array further comprises a first row of strap cells and a second row of strap cells, the first row of strap cells being disposed on a first edge of the columns of the 2PSRAM cells, the second row being disposed on a second edge of the columns of the 2PSRAM cells opposite from the first edge.

12. The structure of claim 11, wherein the memory array further comprises a first metallization level over the substrate, the first metallization level comprising, for each of the columns of 2PSRAM cells in the memory array:
  a first power node metallization trace extending along the respective column, a first connection electrically coupling the first power node metallization trace to the first power node active area in the respective strap cell of the first row of strap cells in the respective column, a second connection electrically coupling the first power node metallization trace to the first power node active area in the respective strap cell of the second row of strap cells in the respective column,
  a write second power node metallization trace extending along the respective column, a third connection electrically coupling the write second power node metallization trace to the write second power node active area in the respective strap cell of the first row of strap cells in the respective column, a fourth connection electrically coupling the write second power node metallization trace to the write second power node active area in the respective strap cell of the second row of strap cells in the respective column,
  a write bit line node metallization trace extending along the respective column, a fifth connection electrically coupling the write bit line node metallization trace to the write bit line node active area in the respective strap cell of the first row of strap cells in the respective column, a sixth connection electrically coupling the write bit line node metallization trace to the write bit line node active area in the respective strap cell of the second row of strap cells in the respective column, and
  a complementary write bit line node metallization trace extending along the respective column, a seventh connection electrically coupling the complementary write bit line node metallization trace to the complementary write bit line node active area in the respective strap cell of the first row of strap cells in the respective column, an eighth connection electrically coupling the complementary write bit line node metallization trace to the complementary write bit line node active area in the respective strap cell of the second row of strap cells in the respective column.

13. The structure of claim 11, wherein the memory array further comprises a first metallization level over the substrate and a second metallization level over the substrate,
  the first metallization level comprising, for each of the columns of 2PSRAM cells in the memory array:
    a first power node metallization trace extending along the respective column,
    a write second power node metallization trace extending along the respective column, and
    a read-port second power node metallization trace extending along the respective column,
  the second metallization level comprising, for each of the first row of strap cells and the second row of strap cells:
    a mesh first power node metallization trace extending along the respective row of strap cells, and
    a mesh second power node metallization trace extending along the respective row of strap cells, and
  for each of the strap cells:
    a first connection electrically coupling the first power node metallization trace at the respective strap cell to the mesh first power node metallization trace at the respective strap cell,
    a second connection electrically coupling the write second power node metallization trace at the respective strap cell to the mesh second power node metallization trace at the respective strap cell, and
    a third connection electrically coupling the read-port second power node metallization trace at the respective strap cell to the mesh second power node metallization trace at the respective strap cell.

14. The structure of claim 10, wherein the memory array further comprises a first metallization level over the substrate and a second metallization level over the first metallization level,
  the first metallization level comprising, for each column of 2PSRAM cells:
    a read-port bit line node metallization trace extending along the respective column, for each of the 2PSRAM cells in the respective column, the first source/drain region of the read-port pass-gate vertical transistor being electrically coupled to the read-port bit line node metallization trace, and
    a read-port second power node metallization trace extending along the respective column, for each of the 2PSRAM cells in the respective column, the first source/drain region of the read-port pull-down vertical transistor being electrically coupled to the read-port second power node metallization trace, and
  the second metallization level comprising, for each of the rows of 2PSRAM cells:
    a read-port word line node metallization trace extending along the respective row, for each of the 2PSRAM cells in the respective row, a gate of the read-port pass-gate vertical transistor being electrically coupled to the read-port word line node metallization trace, and
    a write-port word line node metallization trace extending along the respective row, for each of the 2PSRAM cells in the respective row, respective gates of the first pass-gate vertical transistor and the second pass-gate transistor being electrically coupled to the write-port word line node metallization trace.

15. The structure of claim 14, wherein the first metallization level further comprises, for each column of 2PSRAM cells:
  a write bit line node metallization trace extending along the respective column,
  a first power node metallization trace extending along the respective column,
  a write second power node metallization trace extending along the respective column, and
  a complementary write bit line node metallization trace extending along the respective column, no via extending to or from any of the write bit line node metallization trace, the first power node metallization trace, the write second power node metallization trace, and the complementary write bit line node metallization trace within areas of the 2PSRAM cells in the respective column.

16. The structure of claim 10, wherein the memory array further comprises, in each of the columns of 2PSRAM cells in the memory array:
  a first p-well in the substrate and extending along the respective column, the first power node active area and the write bit line node active area of the respective column being disposed in the first p-well, the first p-well further extending into a first respective adjacent column as the first p-well of the first respective adjacent column, an n-well in the substrate and extending along the respective column, the write second power node active area of the respective column being disposed in the n-well, and a second p-well in the substrate and extending along the respective column, the n-well being disposed between the first p-well and the second p-well, the complementary write bit line node active area of the respective column being disposed in the second p-well, the local node active area of each of the 2PSRAM cells in the respective column being disposed in the second p-well, the second p-well further extending into a second respective adjacent column as the second p-well of the second respective adjacent column.

17. A method comprising:

defining a first power node active area, a write second power node active area, a write bit line node active area, a complementary write bit line node active area, and a local node active area in a substrate;

forming, in an area, a first vertical channel structure, a second vertical channel structure, a third vertical channel structure, a fourth vertical channel structure, a fifth vertical channel structure, a sixth vertical channel structure, a seventh vertical channel structure, and an eighth vertical channel structure, each of the first, second, third, fourth, fifth, sixth, seventh, and eighth vertical channel structures comprising a first source/drain region disposed in a respective active area, a channel region above the first source/drain region, and a second source/drain region above the channel region, the first source/drain region of the first vertical channel structure being disposed in the first power node active area, the first source/drain region of the second vertical channel structure being disposed in the first power node active area, the first source/drain region of the third vertical channel structure being disposed in the write second power node active area, the first source/drain region of the fourth vertical channel structure being disposed in the write second power node active area, the first source/drain region of the fifth vertical channel structure being disposed in the write bit line node active area, the first source/drain region of the sixth vertical channel structure being disposed in the complementary write bit line node active area, the first source/drain region of the seventh vertical channel structure being disposed in the local node active area, the first source/drain region of the eighth vertical channel structure being disposed in the local node active area;

forming a first gate electrode, a second gate electrode, a third gate electrode, a fourth gate electrode, and a fifth gate electrode over the substrate, the first gate electrode being around the first vertical channel structure, the third vertical channel structure, and the seventh vertical channel structure, the second gate electrode being around the second vertical channel structure and the fourth vertical channel structure, the third gate electrode being around the fifth vertical channel structure, the fourth gate electrode being around the sixth vertical channel structure, the fifth gate electrode being around the eighth vertical channel structure; and electrically coupling the respective second source/drain regions of the first vertical channel structure, the third vertical channel structure, and the fifth vertical channel structure together and to the second gate electrode, and electrically coupling the respective second source/drain regions of the second vertical channel structure, the fourth vertical channel structure, and the sixth vertical channel structure together and to the first gate electrode.

18. The method of claim 17 further comprising:

forming a first metallization level comprising a read-port bit line node metallization trace and a read-port second power node metallization trace, the read-port bit line node metallization trace being electrically coupled to the second source/drain region of the eighth vertical channel structure, the read-port second power node metallization trace being electrically coupled to the second source/drain region of the seventh vertical channel structure; and forming a second metallization level comprising a write-port word line node metallization trace and a read-port word line node metallization trace, the write-port word line node metallization trace being electrically coupled to the third gate electrode and the fourth gate electrode, the read-port word line node metallization trace being electrically coupled to the fifth gate electrode.

19. The method of claim 18, wherein the first metallization level further comprises a write bit line node metallization trace, a write second power node metallization trace, a first power node metallization trace, and a complementary write bit line node metallization trace.

20. The method of claim 19, wherein after the forming the second metallization level, no contact physically couples any of the first power node active area, the write second power node active area, the write bit line node active area, the complementary write bit line node active area, and the local node active area in the area.

* * * * *